(12) United States Patent
Oshima et al.

(10) Patent No.: US 6,558,873 B1
(45) Date of Patent: May 6, 2003

(54) LITHOGRAPHIC PRINTING PLATE PRECURSOR

(75) Inventors: Yasuhito Oshima, Shizuoka (JP); Tadahiro Sorori, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 0 days.

(21) Appl. No.: 09/678,738

(22) Filed: Oct. 4, 2000

(30) Foreign Application Priority Data

| Oct. 5, 1999 | (JP) | ............................................. 11-284091 |
| Nov. 12, 1999 | (JP) | ............................................. 11-322641 |
| Jan. 24, 2000 | (JP) | ....................................... 2000-014697 |

(51) Int. Cl.$^7$ .................................................. G03F 7/11
(52) U.S. Cl. ................................. 430/276.1; 430/275.1; 430/278.1
(58) Field of Search ............................ 430/275.1, 278.1, 430/276.1

(56) References Cited

U.S. PATENT DOCUMENTS

| 3,617,411 | A | | 11/1971 | Couture et al. | |
| 4,388,156 | A | * | 6/1983 | Gillich et al. | ............... 204/14 N |
| 4,463,112 | A | * | 7/1984 | Leistner et al. | ............... 524/109 |
| 4,640,886 | A | * | 2/1987 | Miller et al. | ............... 430/271.1 |
| 4,886,731 | A | * | 12/1989 | Sypek et al. | ................. 430/156 |
| 4,956,261 | A | | 9/1990 | Pawlowski et al. | ......... 430/156 |
| 5,476,754 | A | | 12/1995 | Imai et al. | |
| 5,637,441 | A | * | 6/1997 | Brenk et al. | .............. 430/278.1 |
| 5,725,991 | A | * | 3/1998 | Gries | ....................... 430/278.1 |
| 5,807,659 | A | * | 9/1998 | Nishimiya et al. | ........... 430/302 |
| 2002/0018969 | A1 | * | 2/2002 | Qiao et al. | .................... 430/531 |

FOREIGN PATENT DOCUMENTS

| DE | 41 05 887 A1 | 9/1991 |
| DE | 40 23 268 A1 | 1/1992 |
| EP | 0 727 714 A1 | 8/1996 |
| EP | 0 871 070 A2 | 10/1998 |
| EP | 0 904 954 A2 | 3/1999 |
| EP | 0 965 887 A1 | 12/1999 |
| JP | 62-050760 A | 3/1987 |
| JP | 63-163857 A | 7/1988 |
| JP | 3-122647 | 5/1991 |

OTHER PUBLICATIONS

Patent Abstracts of Japan, Publication No. 62050760, Mar. 5, 1987, Photosensitive Lithographic Printing Plate Requiring No Dampening Water.
Patent Abstracts of Japan, Publication No. 63163857, Jul. 7, 1988, Waterless Lithographic Printing Plate.
EPO Search Report dated Mar. 12, 2002, in EP Application No. 00121271.1–2208.
"Sequence", The American Heritage Dictionary second College Edition, Houghton Mifflin Company, Boston, Ma, 1976, p. 1119.*
Patent Abstracts of Japan, Publication No. 09269593, Oct. 14, 1997, Photosensitive Planographic Printing Plate.
EPO Search Report dated May 21, 2002, in EP Application No. 00121271.1.

* cited by examiner

*Primary Examiner*—Cynthia Hamilton
(74) *Attorney, Agent, or Firm*—Burns, Doane, Swecker & Mathis, LLP

(57) ABSTRACT

A lithographic printing plate precursor comprises a hydrophilized aluminum support having provided thereon an interlayer and a photopolymerizable photosensitive layer, the interlayer containing a polymer having a cationic group and a radical reactive group or containing a compound capable of forming a complex with ammonium, and the photopolymerizable photosensitive layer containing a photopolymerization initiator, a compound having an addition polymerizable ethylenically unsaturated bond, and a polymer binder.

10 Claims, No Drawings

LITHOGRAPHIC PRINTING PLATE PRECURSOR

FIELD OF THE INVENTION

The present invention relates to a lithographic printing plate precursor, more specifically, the present invention relates to a lithographic printing plate precursor suitable for the drawing of an image by a laser ray.

BACKGROUND OF THE INVENTION

For the lithographic printing plate precursor, a PS plate comprising a hydrophilic support having provided thereon an ink-receptive photosensitive resin layer has heretofore been widely used. According to the plate-making process therefor, a plate is subjected to mask exposure (surface exposure) through a lith film and then the non-image area is dissolved and removed to obtain a desired printing plate.

In recent years, digitization technologies of electrically processing, storing and outputting image information using a computer have been widespread. To cope with this digitization technology, various new methods for outputting an image have been proposed and put into practical use. In pace with this tendency, demands are increasing for a computer-to-plate (CTP) technique capable of directly producing a printing plate by scanning a ray having high directivity, such as laser ray, according to the digitized image information without any intervention of a lithographic film. Thus, it is an important technical matter to obtain a printing plate precursor suitable therefor.

As one system for obtaining a lithographic printing plate precursor by scanning exposure, a constitution where a layer containing a photopolymerizable composition having excellent photosensitive speed is provided as a lipophilic (ink-receptive) photosensitive resin layer (hereinafter also called photosensitive layer) provided on a hydrophilic support and further an oxygen-cutting protective layer is provided, has been proposed and this is already available on the market. The lithographic printing plate precursor having such a constitution is facilitated in the development processing and can provide a printing plate having desired printing capabilities such as high resolution, good inking property and long press life.

However, the printing plate produced from this conventional high-sensitivity photopolymerization-type lithographic printing plate precursor has a problem in that due to insufficient adhesion between the image area and the support, the image area is slipped or thinned when a large number of sheets are printed, though this may vary depending on the use conditions.

Heretofore, for improving the adhesion between the support and a photopolymerizable photosensitive layer of a lithographic printing plate precursor, a method of providing an interlayer containing an organic phosphoric acid-base compound is widely known, but this is not sufficient in view of the press life.

JP-A-7-159983 (the term "JP-A" as used herein means an "unexamined published Japanese patent application") discloses a sol-gel interlayer containing a polymerizable group and JP-A-9-269593 discloses a sol-gel interlayer having further added thereto a phenolic compound or a phosphoric acid compound. These may surely give good adhesion but depending on the development conditions or the like, there is still a problem that the non-image area is scummed.

SUMMARY OF THE INVENTION

Accordingly, the object of the present invention is to provide a lithographic printing plate precursor which can overcome the above-described defects of conventional techniques and ensure both high adhesion and excellent scum resistance, particularly a lithographic printing plate precursor suitable for the drawing of an image by a laser ray.

As a result of extensive investigations to attain the above-described object, the present inventors have found that this object can be attained by providing an interlayer containing a polymer having a cationic group and a radical reactive group or an interlayer containing a compound capable of forming a complex with aluminum, between a support and a photopolymerizable photosensitive layer of a lithographic printing plate precursor. The present invention has been accomplished based on this finding.

More specifically, the present invention provides:

(1) A lithographic printing plate precursor comprising a hydrophilized aluminum support having provided thereon in sequence an interlayer and a photopolymerizable photosensitive layer, the interlayer containing a polymer having a cationic group and a radical reactive group and the photopolymerizable photosensitive layer containing a photopolymerization initiator, a compound having an addition polymerizable ethylenically unsaturated bond, and a polymer binder;

(2) A lithographic printing plate precursor comprising a hydrophilized aluminum support having provided thereon in sequence an interlayer containing a compound capable of forming a complex with aluminum and a photopolymerizable photosensitive layer containing a photopolymerization initiator, a compound having an addition polymerizable ethylenically unsaturated bond, and a polymer binder, the compound capable of forming a complex with aluminum giving a stability constant in the aluminum complex such that the common logarithmic value thereof is 3 or more;

(3) A lithographic printing plate precursor comprising a hydrophilized aluminum support having provided thereon in sequence an interlayer containing a compound capable of forming a complex with aluminum and a photopolymerizable photosensitive layer containing a photopolymerization initiator, a compound having an addition polymerizable ethylenically unsaturated bond, and a polymer binder, the compound capable of forming a complex with aluminum being a polymer; and (4) The lithographic printing plate precursor as described in (3) above, wherein the compound capable of forming a complex with aluminum is a polymer having a structure represented by formula (I) or (II) on the side chain:

wherein R represents a hydrocarbon group having from 1 to 30 carbon atoms, which may have a substituent, Y represents a linking group to the polymer main chain skeleton, and Ar represents a heteroaryl group having one or more nitrogen atom, which may have a substituent.

One of the characteristic features of the lithographic printing plate precursor of the present invention is to provide an interlayer containing a polymer having a cationic group and a radical reactive group or an interlayer containing a compound capable of forming a complex with aluminum, so as to improve the adhesion between the photosensitive layer and the support. The lithographic printing plate precursor of the present invention can provide a printing plate favored with both long press life and excellent scumming resistance as compared with conventional printing plates using an interlayer containing an organic phosphoric acid-base compound or the like. The effect of the polymer having a cationic group and a radial reactive group is not yet clearly known, however, the following reasons may be considered. The polymer used in the interlayer has a cationic group, therefore, interacts with the anionic inorganic material on the substrate surface to exert firm adhesion to the substrate. The cationic group itself is hydrophilic and can be substantially removed by an aqueous developer, therefore, complete removal thereof can be attained on the unexposed area and no scumming is generated. On the other hand, on the exposed area, the radical reactive group forms a molecular bond with the photopolymerizable photosensitive layer and/or the radial reactive group itself due to the action of a radical generated upon exposure, therefore, the exposed area is gelled and cannot be removed by the developer and the high adhesion by the cationic group ensures a sufficiently long press life. From the standpoint of imparting sufficiently high adhesion and long press life, it is important in the present invention to use the compound having a cationic group and a radical reactive group as a polymer but not as a low molecular weight compound or oligomer.

The effect of the compound capable of forming a complex with aluminum is not yet elucidated, however, the following reasons may be presumed. The compound used in the interlayer coordinates to the aluminum on the substrate and forms a complex, whereby coordination to the aluminum metal on the substrate surface is attained and firm adhesion to the substrate is realized. The compound capable of forming a complex with aluminum adheres to the aluminum substrate by an interaction such as Coulomb force, therefore, can be substantially removed by an aqueous developer. In the unexposed area, the compound is completely removed, so that scumming does not occur. In the exposed area, the photosensitive composition of the upper layer is photocured and the developer does not permeate into the interlayer, so that the firm adhesion can be maintained.

DETAILED DESCRIPTION OF THE INVENTION

Interlayer

The interlayer as a characteristic feature of the lithographic printing plate precursor of the present invention is described below.

In one embodiment of the present invention, the interlayer of the lithographic printing plate precursor of the present invention contains at least one polymer having a cationic group and a radical reactive group.

In the polymer of the present invention, the main chain structure is preferably (1) acrylic resin, styrene-type resin or a copolymer thereof, (2) urethane resin, (3) polyester resin or (4) polyamide resin. In view of the press life and synthesis aptitude, the main chain structure is preferably (1) acrylic resin, styrene-type resin or a copolymer thereof. The molecular weight may be freely selected according to the capability designed for the lithographic printing plate precursor. When the weight-average molecular is low, good results may be obtained in view of the scumming resistance, whereas when it is high, a long press life can be obtained. The weight-average molecular weight is preferably from 2,000 to 1,000,000, more preferably from 5,000 to 100,000.

Examples of the cationic group include cationic groups comprising an atom belonging to Group V or Group VI of the Periodic Table. Among these, preferred are cationic groups comprising nitrogen atom, phosphorus atom or sulfur atom, more preferred is a cationic group comprising nitrogen atom.

Examples of the radical reactive group include addition-polymerizable unsaturated bonds (e.g., (meth)-acryloyl group, (meth)acrylamide group, (meth)acrylonitrile group, allyl group, styrene structure, vinyl ether structure, acetylene structure), —SH, —PH, SiH, —GeH and disulfide structures. Among these, preferred in view of the press life are addition-polymerizable unsaturated bonds. The term "(meth) acryl group" as used herein means an acryl group or a methacryl group.

Specific examples of the synthesis method of the polymer having a cationic group and a radical reactive group for use in the present invention are described below, however, the present invention is not limited thereto.
(1) Acrylic Resin, Styrene-Base Resin or Copolymer Thereof For introducing a cationic group and a radical reactive group into acrylic resin, styrene-base resin or a copolymer thereof, the following methods (1)-1 to (1)-5 may be used.
(1)-1 A method of copolymerizing an acrylic or styrene-base monomer having a cationic group with an acrylic or styrene-base monomer having at least one reactive functional group to form a polymer having the reactive group on the side chain and reacting the polymer obtained with a compound simultaneously having a group capable of reacting with the reactive functional group and a radical reactive group to introduce the radical reactive group.

Examples of the acrylic or styrene-base monomer having a cationic group include the compounds represented by the following formulae (1) to (3):

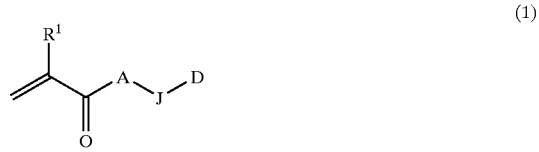

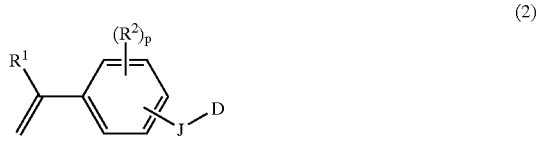

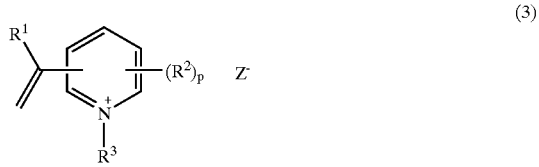

wherein $R^1$ represents hydrogen atom or a methyl group, $R^2$ represents a substituent, $R^3$ represents an alkyl group having from 1 to 20 carbon atoms, which may have a substituent, or an aralkyl group, A represents oxygen atom or $NR^4$ (wherein $R^4$ represents hydrogen atom or a hydrocarbon group having from 1 to 10 carbon atoms, which may have a substituent), J represents a single bond or a divalent linking group, D represents a cationic group, $Z^{31}$ represents a monovalent anion selected from the group consisting of a halogen ion, $ClO_4^-$, $BF_4^-$, $PF_6^-$, $SbF_6^-$, $AsF_6^-$, $SO_3^-$, an alkylsulfonate ion and an arylsulfonate ion, and p represents an integer of 0 to 4, provided that when p is 2, 3 or 4, $R^2$ may be the same or different.

$R^2$ may be an arbitrary substituent comprising a nonmetallic atom and preferred examples of the substituent include a halogen atom (e.g., fluorine atom, chlorine atom, bromine atom, iodine atom), an alkyl group having from 1 to 5 carbon atoms, which may have a substituent, and an alkoxy group.

$R^3$ represents an alkyl group having from 1 to 20 carbon atoms, which may have a substituent, or an aralkyl group and specific preferred examples thereof include a methyl group, an ethyl group, an n-pentyl group, an i-pentyl group, a neopentyl group, an n-hexyl group, a cyclohexyl group, a methoxyethyl group, a 2-hydroxypropyl group, a carboxymethyl group, a 1,2-epoxypropyl group, a 2-methylthioethyl group, 2-(methoxycarbonyl)ethyl group, a 4-chlorohexyl group, a 2-methyl-2-pentenyl group, a perfluorohexyl group, —$CH_2CH_2SO_3^-$ (in this case, $Z^-$ is not necessary), a tetrahydrofurfuryl group, a benzyl group, a 4-(t-butyl)benzyl group, a 3,5-bis(trifluoromethyl)benzyl group, a naphth-2-ylmethyl group and a phenethyl group.

J represents a single bond or a divalent linking group. The divalent linking group may be an arbitrary linking group comprising a nonmetallic atom. The linking group is preferably a divalent hydrocarbon group having from 1 to 20 carbon atoms, which may have a substituent and may have one or more interruptions by a group selected from the group consisting of —O—, —S—, —$NR^4$—, —CO—, —$SO_2$—, —$NR^4CO$—, —$NR^4COO$— and —$NR^4CONR^4$— (wherein $R^4$ has the same meaning as defined in formula (1), provided that when a plurality of $R^4$ are present, they may be the same or different), more preferably a hydrocarbon group having from 1 to 20 carbon atoms, which is neither interrupted nor substituted.

D represents a cationic group and specific examples thereof include the cationic groups represented by the following formulae (4) to (6):

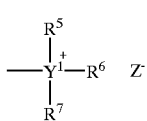
(4)

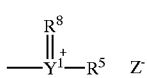
(5)

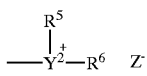
(6)

wherein $R^5$ to $R^7$ each independently represents hydrogen atom, an alkyl group having from 1 to 20 carbon atoms, which may have a substituent, an aryl group or an aralkyl group, $R^8$ represents an alkylidene group having from 1 to 20 carbon atoms, which may have a substituent, $R^4$, $R^5$, $R^6$, $R^7$ or $R^8$ may be combined with each other or with a part of J to form a ring, $Y^1$ represents nitrogen atom or phosphorus atom, $Y^2$ represents sulfur atom and $Z^-$ has the same meaning as defined in formula (3).

Among the cationic groups represented by formulae (4) to (6), preferred are the cationic groups represented by formulae (4) and (5) where $Y^1$ is nitrogen atom.

Specific examples of the acrylic or styrene-base monomer having a cationic group are set forth below, however, the present invention is by no means limited thereto.

(Specific Examples of Monomer Having Cationic Group)

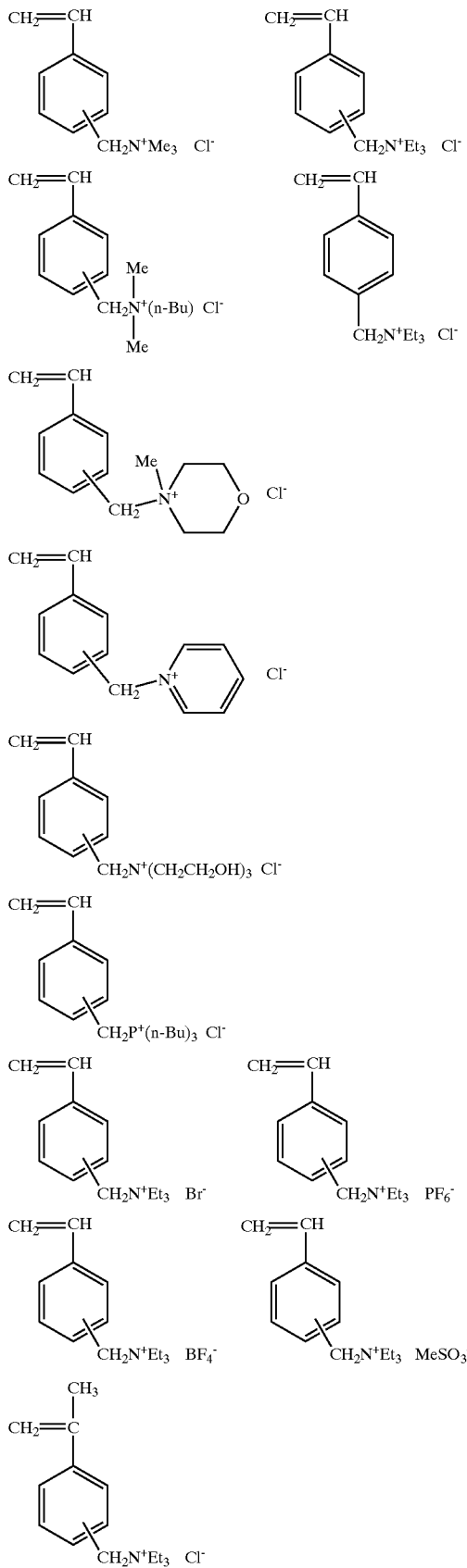

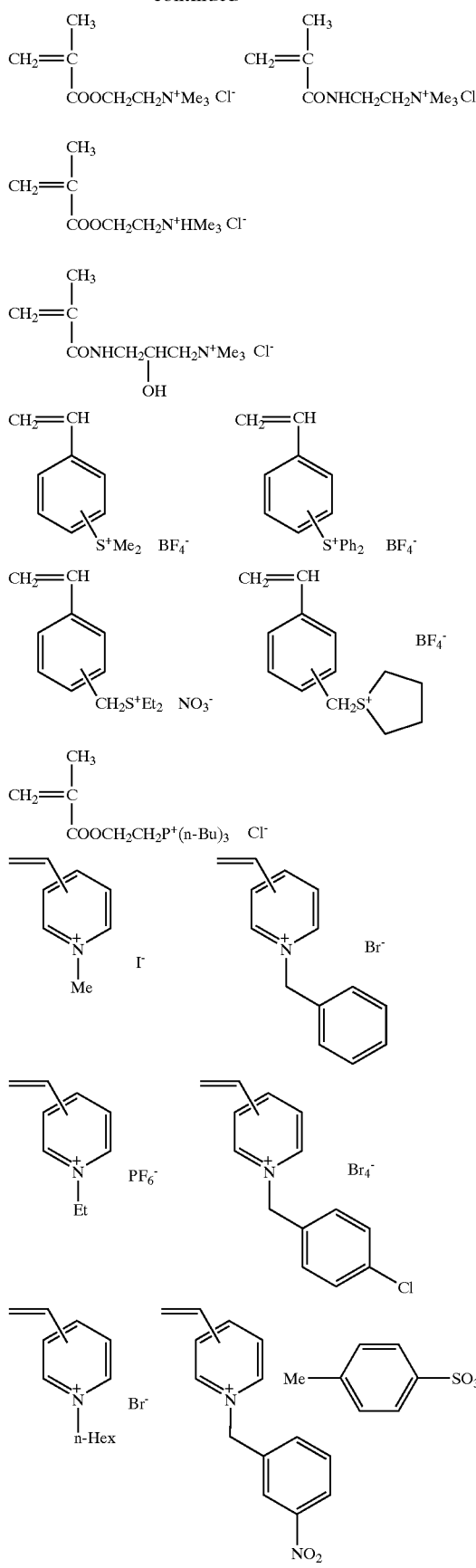
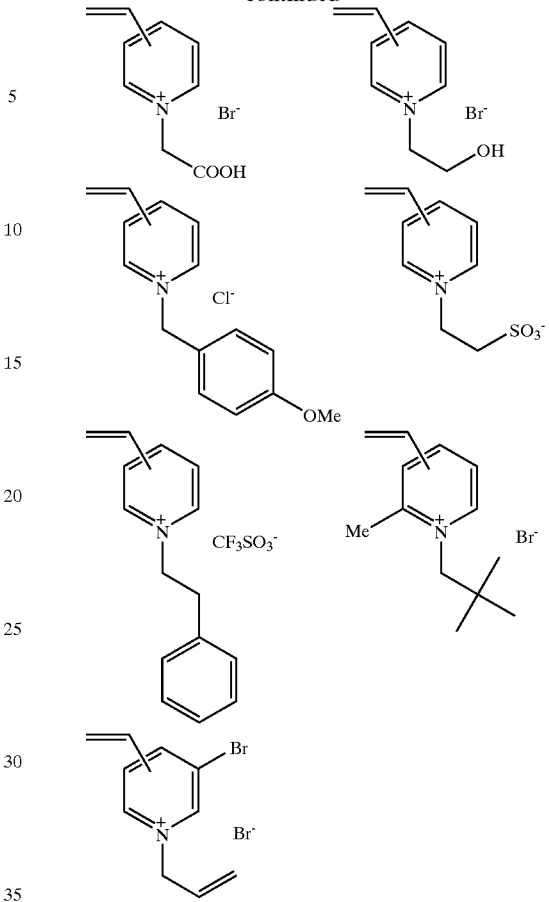

Examples of the acrylic or styrene-base monomer having at least one reactive functional group include respective derivatives of acrylic acid ester, methacrylic acid ester, acrylamide, methacrylamide and styrene, represented by the following formulae (7) and (8):

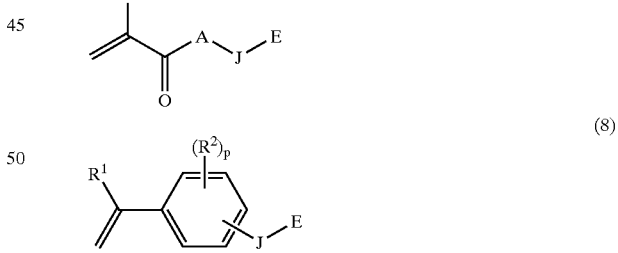

wherein E represents a reactive functional group selected from the group consisting of a hydroxyl group, a carbonyl halogenide group, a carboxyl group and a salt thereof, an amino group, an epoxy group and a haloalkyl group, and A, $R^1$, $R^2$, J and p have the same meanings as defined in formulae (1) and (2).

Specific examples of the acrylic or styrene-base monomer having at least one reactive functional group include acrylic acid, methacrylic acid derivatives, acrylic acid ester derivatives, methacrylic acid ester derivatives, acrylamide and methacrylamide derivatives, having a reactive functional group selected from the group consisting of a hydroxyl group, a carbonyl halogenide group, a carboxyl group and a salt thereof, an amino group, an epoxy group and a haloalkyl group described in *Kobunshi Data Handbook-Kiso Hen-(Polymer Data Handbook-Fundamental-)*, compiled by Konbunshi Gakkai, Baifukan (1986).

In the case where an acrylic or styrene-base monomer having at least one reactive functional group and an acrylic or styrene-base monomer having a cationic group are copolymerized to prepare a polymer having the reactive functional group on the side chain, the acrylic or styrene-base monomer having at least one reactive functional. group may be used solely or in combination of two or more thereof. Also, the acrylic or styrene-base monomer having a cationic group may be used solely or in combination of two or more thereof.

If desired, one or more other monomer may be copolymerized in combination to form a tertiary or greater copolymer. The monomer used here is preferably a monomer having an acid group from the standpoint of imparting alkali developability to the interlayer. The acid group is preferably an. acid group having an acid dissociation constant (pKa) or 7 or less, more preferably —COOH—, —$SO_3H$, —$OSO_3H$, —$PO_3H_2$, —$OPO_3H_2$, —$CONHSO_2$— or —$SO_2NHSO_2$—. Specific examples of such a monomer include those described in JP-A-11-84674.

For the copolymerization, a conventionally known polymerization method may be used. The form of the polymer is preferably a random copolymer, a block copolymer or a graft copolymer.

The thus-obtained polymer having a reactive functional group on the side chain is subjected to a polymer reaction with a compound simultaneously having a group capable of reacting with the reactive functional group and a radical reactive group using a method selected from the reactions described below to introduce the radical reactive group, thereby preparing a polymer having a cationic group and a radical reactive group for use in the present invention.

a) A urethane-forming reaction of the hydroxyl group on the polymer side chain using an isocyanate having a radical reactive group;

b) an esterification reaction of the hydroxyl group on the polymer side chain using a carboxylic acid, carboxylic acid halide, sulfonic acid halide or carboxylic acid anhydride having a radical reactive group;

c) an esterification reaction of the carboxyl group or a salt thereof on the polymer side chain using an isocyanate having a radical reactive group;

d) an esterification reaction of the carbonyl halogenide on the polymer side chain using an alcohol having a carboxyl group or a salt thereof and a radical reactive group;

e) an amidation reaction of the carbonyl halogenide on the polymer side chain using an amine having a carboxyl group or a salt thereof and a radical reactive group;

f) a urea-forming reaction of the amino group on the polymer side chain using an isocyanate having a radical reactive group;

g) an amidation reaction of the amino group on the polymer side chain using a carboxylic acid, carboxylic acid halide, sulfonic acid halide or carboxylic acid anhydride having a radical reactive group;

h) a ring-opening reaction of the epoxy group on the polymer side chain using various nucleophilic compounds having a radical reactive group; and i) an etherification reaction of the haloalkyl group on the polymer side chain using an alcohol having a radical reactive group.

(1)-2) A method of polymerizing a monomer represented by the following formula (9) to (11) to form a polymer and reacting it with a compound simultaneously having a haloalkyl group and a radical reactive group to simultaneously introduce a cationic group and a radical reactive group at the same time:

wherein $R^1$, $R^2$, A, J and p have the same meaning as defined in formulae (1) and (2) and G represents a group represented by the following formula (12) or (13):

wherein $R^5$, $R^6$, $Y^1$ and $Y^2$ have the same meanings a defined in formulae (4) to (6), and $R^5$ and $R^6$ may be combined with each other or with a part of J to form a ring.

Among the groups represented by formulae (12) and (13), groups wherein $Y^1$ is a nitrogen atom are preferred because the synthesis is easy.

Specific examples of the monomers represented by formula (9) to (11) include 7-amino-3,7-dimethyloctyl methacrylate, 2-(5-ethyl-2-pyridyl)ethyl acrylate, 2-(dimethylamino)ethyl acrylate, 3-(dimethylamino)phenyl acrylate, 2-(dimethylamino)-2-methylpropyl acrylate, 2-hydroxy-3-piperidinopropyl acrylate, (2-diethylamino) ethyl methacrylate, (dicyclohexylamino)ethyl methacrylate, N-(2-dimethylaminoethyl)acrylamide, N-2-(morpholinoethyl)acrylamide, N-(3-diethylaminopropyl) acrylamide, N-(1,1-dimethyl-3-dimethylaminopropyl) acrylamide, N-(1,3-dimethylmorpholinobutyl)-acrylamide, N-(1,3-dimethylpyrrolidinobutyl) acrylamide, N-[4-(phenylamino)phenyl]acrylamide, N-(2-dimethylaminoethyl)methacrylamide, N-(2,2-dimethyl-3-dimethylaminopropyl)methacrylamide, aminostyrene, N,N-dimethylaminostyrene, 4-amino-3-nitrostyrene, (aminomethyl)styrene, vinylbenzylallylamine, N-(vinylbenzyl)piperidine, N-(vinylbenzyl)morpholine, (2-aminoethyl)styrene, (diethylaminoethyl)styrene, (vinylphenyl)methylsulfide, (vinylphenyl)methylsulfide, vinylpyridine, 2-vinyl-5-methylpyridine, 5-ethyl-2-vinylpyrridine and 5-bromo-3-vinylpyridine.

The monomer represented by formula (8) or (9) may be used solely or in combination of two or more thereof.

If desired, one or more other monomer may be copolymerized in combination to form binary or greater copolymer. The monomer used here is preferably a monomer having an acid group described above.

By reacting the polymer thus obtained by polymerizing the monomer represented by formulae (9) to (11) with a compound simultaneously having a haloalkyl group and a radical reactive group, a cationic group and a radical reactive group can be introduced at the same time and the polymer having a cationic group and a radical reactive group for use in the present invention can be obtained. At this time, the compound simultaneously having a haloalkyl group and a radical reactive group may be used solely or in combination of two or more thereof.

Specific examples of the compound simultaneously having a haloalkyl group and a radical reactive group include 3-bromo-1-propyne, 1-bromo-2-butyne, 6-bromo-1-hexyne, 2-bromoethyl vinyl ether, 3-iodopropyl vinyl ether, 6-iodohexyl vinyl ether, 2-bromoethyl acrylate, cinnamyl bromide, chloromethylstyrene, vinyl benzyl bromide, allyl bromide and allyl iodide.

(1)-3) A method of polymerizing a monomer represented by the following formula (14) or (15) to prepare a polymer having —$CH_2X$ group on the side chain and reacting therewith a compound represented by any one of the following formulae (16) to (18) to simultaneously introduce a cationic group and a radical reactive group:

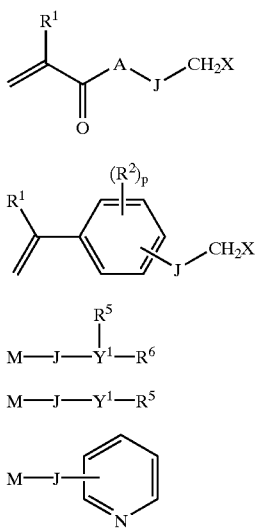

wherein $R^1$, $R^2$, $R^5$, $R^6$, A, J, $Y^1$, $Y^2$ and p have the same meanings as in formulae (1) to (6), X represents an atom selected from the group consisting of chlorine, bromine and iodine, and M represents a radical reactive group.

Specific examples of the compound represented by formula (14) or (15) include 2-bromoethyl acrylate, chloromethylsytrene and bromomethylstyrene.

The monomer represented by formula (14) or (15) may be used solely or in combination of two or more thereof.

If desired, one or more other monomer may be copolymerized in combination to form a binary or greater copolymer. The monomer used here is preferably a monomer having an acid group described above.

By reacting the polymer having a —$CH_2X$ group on the side chain, obtained by polymerizing the monomer represented by formula (14) or (15), with the compound simultaneously having a group capable of reacting with the —$CH_2X$ group to produce a cationic group and a radical reactive group, represented by formulae (16) to (18), the polymer having a cationic group and a radical reactive group for use in the present invention can be obtained.

Specific examples of the compounds represented by formulae (16) to (18) include, in addition to the compounds described as specific examples of the monomers represented by formulae (9) to (11), 1-diethylamino-1-hexyne, 2-dimethylaminoethyl vinyl ether, diethanolamine monovinyl ether, 2-phenylaminoethyl vinyl ether, 2-pyrrolidylethyl monovinyl ether, 2-methylthioethyl vinyl ether, 2-allylthioethyl vinyl ether, 3-neopentylthiopropyl vinyl ether, 3-benzylthiorpopyl vinyl ether, 2-phenylthioethyl vinyl ether, triallylamine, 3-(4-dimethylaminophenyl)-2-(4-methoxyphenyl)acrylonitrile, diallylsulfide and pyridylacetylene.

Among the compounds represented by formulae (16) to (18), the compounds represented by formulae (16) and (17) where $Y^1$ is nitrogen atom, and the compound represented by formula (18) are preferred because of easy synthesis. The compound represented by formula (16) or (17) can be used solely or in combination of two or more thereof.

(1)-4) A method of copolymerizing a monomer having a cationic group with an acrylic or styrene-base monomer having a radical reactive group relatively low in the reaction rate.

Examples of the monomer having a cationic group include those represented by formulae (1) to (3).

Examples of the acrylic or styrene-base monomer having a radical reactive group relatively low in the reaction rate include monomers having an acrylic or styrene structure for forming a main chain skeleton by the polymerization and an unsaturated bond lower in the addition polymerizability than the structure (for example, an allyl group or an acetylene group).

This monomer has at least two radical reactive groups different in the reactivity within the molecule but due to the high radical reactivity of the acryl or styrene structure, the radical reactive group relatively low in the reaction rate does not participate in the polymerization at the copolymerization with the monomer having a cationic group. Accordingly, the radical reactive group can be introduced into the side chain without causing gelling and thereby the polymer having a cationic group and a radical reactive group for use in the present invention can be obtained.

Specific preferred examples of the acrylic or styrene-base monomer having a radical reactive group relatively low in the reaction rate include allyl acrylate, allyl methacrylate, allyloxymethyl methacrylate, acetylmethyl methacrylate, 2-propynyl acrylate, 2-methyl-2-propynyl acrylate, 3-butynyl acrylate, N-allyl acrylamide, N-allyl methacrylamide, allylstyrene, (vinylphenyl)allyl ether and (vinylphenyl)acetylene.

The monomer having a cationic group and the monomer having a radical reactive group relatively low in the reaction rate each may be used solely or in combination of two or more thereof.

If desired, one or more other monomer may be copolymerized in combination to form a ternary or greater copolymer. The monomer used here is preferably a monomer having an acid group described above from the standpoint of imparting alkali developability to the interlayer.

(1)-5) A method of polymerizing a monomer simultaneously having a radical reactive group relatively low in the reaction rate and a cationic group.

Examples of the monomer simultaneously having a radical reactive group relatively low in the reaction rate and a cationic group include the compounds represented by the following formulae (19) to (21):

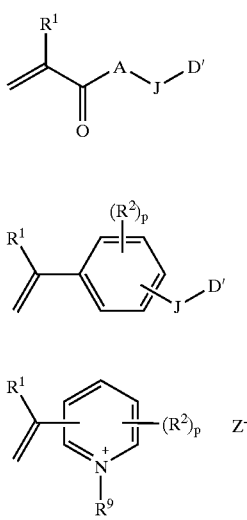

wherein $R^1$, $R^2$, A, J, $Z^-$ and p have the same meanings as defined in formulae (1) to (3), $R^9$ represents an alkyl or aralkyl group having a radical polymerizable group having reactivity lower than the styrene structure constituting the main chain skeleton, and D' represents a cationic group represented by the following formulae (22) to (24):

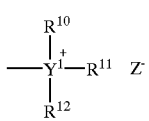

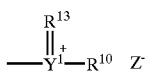

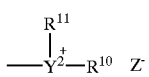

wherein $Y^1$, $Y^2$ and $Z^-$ have the same meanings as defined in formulae (4) to (6), $R^{10}$ to $R^{12}$ each independently represents hydrogen atom, an alkyl group having from 1 to 20 carbon atoms, which may have a substituent, an aryl group or an aralkyl group, $R^{13}$ represents an alkylidene group having from 1 to 20 carbon atoms, which may have a substituent, provided that at least one of $R^{10}$ to $R^{12}$ in formula (22), at least one of $R^{10}$ and $R^{13}$ in formula (23) and at least one of $R^{10}$ and $R^{11}$ in formula (24) have a radical polymerizable group having reactivity lower than the acryl or styrene structure constituting the main chain skeleton, $R^{10}$, $R^{12}$, $R^{12}$ or $R^{13}$ may combine, if possible, with each other or with a part of J to form a ring Among the cationic groups represented by formulae (22) to (24), preferred are the groups represented by formulae (22) and (23) where $Y^1$ is nitrogen atom.

Specific examples of the monomer simultaneously having a radical reactive group relatively low in the reaction rate and a cationic group are set forth below, however, the present invention is by no means limited thereto.

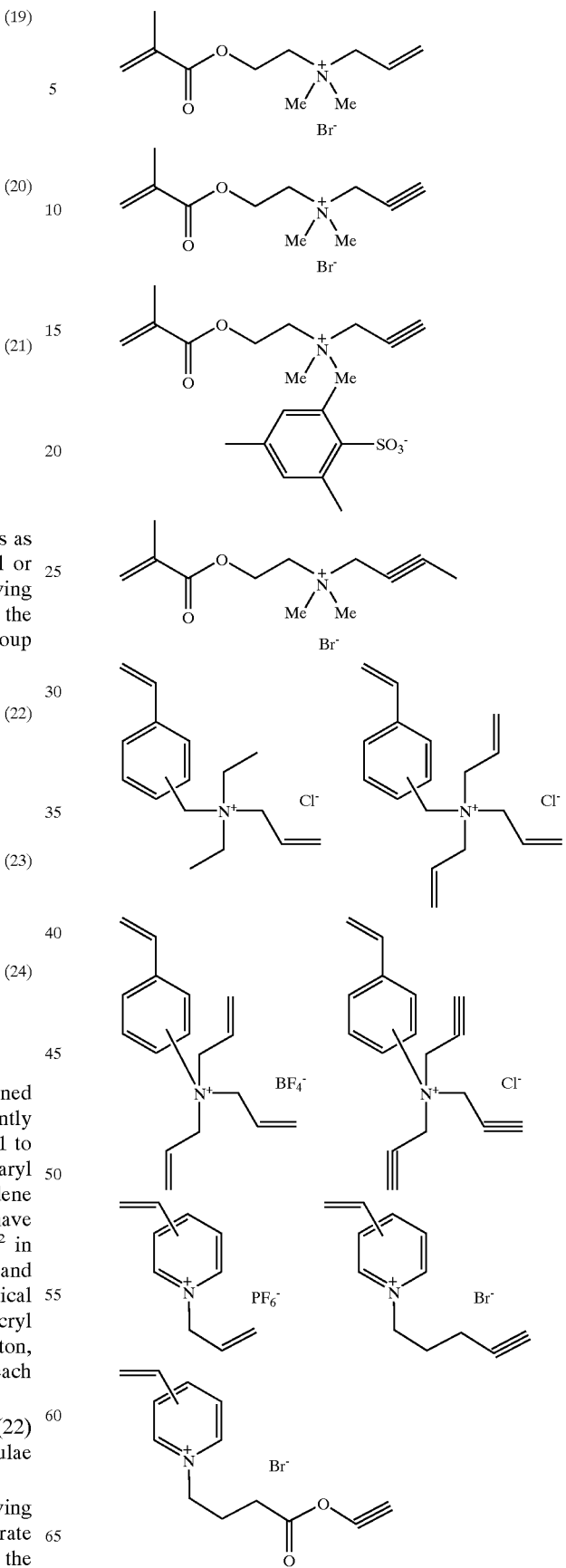

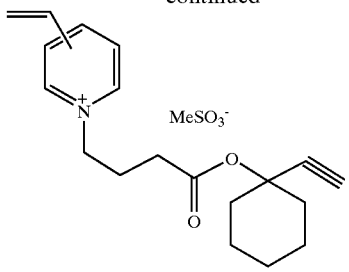

In another embodiment, the interlayer of the lithographic printing plate precursor of the present invention contains at least one compound capable of forming a complex with aluminum.

The compound capable of forming a complex with aluminum preferably forms an aluminum complex of the compound capable of forming a complex with aluminum, such that the common logarithmic value at 25° C. of the aluminum complex stability constant is 3 or more. If the common logarithmic value of the aluminum complex stability constant is less than 3, sufficiently long press life cannot be obtained.

Specific examples of the compound capable of forming a complex with aluminum include benzoic acid, iminodiacetic acid, N-(2-hydroxyethyl)iminodiacetic acid, pyridine-2,6-dicarboxylic acid, 7-iodo-8-hydroxyquinoline-5-sulfonic acid, 2-amino-2-propylphosphonic acid, 1,2-dihydroxybenzene-4-sulfonic acid, tylon, Solochrome violet R, 3-hydroxy-2-naphthoic acid, oxalic acid, oxydiacetic acid, salicylic acid, 5-sulfosalicylic acid, 8-hydroxy-7-(arylazo)-quinoline-5-sulfonic acid, phenylserine, acetohydroxamic acid, 3-hydroxy-5,7-disulfo-2-naphthoic acid, 2,3-dihydroxynaphthalene-6-sulfonic acid, sulfoxine, oxine, acetylacetone, hexafluoroacetylacetone, benzoylacetone, 6,6,7,7,8,8,8-heptafluoro-2,2-dimethyl-3,5-octanedione, trifluoroacetylacetone, dibenzoylmethane, dipivaloylmethane, malonic acid, succinic acid, 3,4-dihydroxybenzoic acid, gallic acid, 2-(3,4-dihydroxyphenyl)-2-(1,1-benzopyrane)-3,5,7-triol, 3-hydroxy-7-sulfo-2-naphthoic acid, 1,2-dihydroxynaphthalene-4-sulfonic acid, N,N-bis(2-hydroxyethyl)glycine, N-(phosphonomethyl)-iminodiacetic aid, N-(2-hydroxyethyl)iminodiacetic acid, iminobis (methylenephosphonic acid), tartaric acid, 1-oxopropane-1, 3-dicarboxylic acid, propane-1,2,3-tricarboxylic aid, citric acid, desferriferrioxamine-B, 1,7-dihydroxy-4-sulfo-2-naphthoic acid, glutamic acid, pyridoxal-5-(dihydrophosphate), nitrilotriacetic acid, amino(phenyl) methylene-diphosphonic acid, ethylenebis-[imino-(2-hydroxyphenyl)methylene(methyl)-phosphonic acid], N-(2-hydroxyethyl)-ethylenedinitrilo-N,N',N'-triacetic acid, ethylenediaminetetraacetic acid, trimethylenedinitrilotetraacetic acid, cyclohexanediaminetetraacetic acid, (2-hydroxytrimethylene)-dinitrilotetraacetic acid, ethylenebis(oxyethylenenitrilo)tetraacetic acid, N,N,N',N'',N''-diethylenetriaminepentaacetic acid, N,N,N',N'',N''',N'''-tetraethylenetetraminehexaacetic acid, semi-xylenol orange, semi-methyl thymol blue, 3-hydroxyglutamic acid, phosphoserine, amino-3-phosphopropionic acid and glyphosphate.

Among these compounds capable of forming a complex with aluminum, preferred are the compounds which form an aluminum complex of the compound capable of forming a complex with aluminum such that the common logarithmic value of the aluminum complex stability constant at 25° C. is 5 or more, more preferably 8 or more.

In the present invention, the case where the compound capable of a complex with aluminum is a polymer is also preferred. The polymer has a group capable of coordinating to aluminum on. the side chain and for the group capable of coordinating to aluminum, functional groups widely and commonly known as the ligand can be used without any limitation, such as nitride, imide, amide, azide, oxo, peroxo, phosphide, phosphite, phosphate, sulfide, dioxosulfate and π-aryl groups.

In the present invention, among the polymer compounds capable of forming a complex with aluminum, polymers having a structure represented by formula (I) and/or (II) on the side chain are preferred.

(wherein R represents a hydrocarbon group having from 1 to 30 carbon atoms, which may have a substituent, Y represents a linking group to the polymer main chain skeleton, and Ar represents a heteroaryl group having at least one nitrogen atom, which may have a substituent).

Examples of the hydrocarbon group having from 1 to 30 carbon atoms include an alkyl group, an alkenyl group, an alkynyl group, an aryl group and a heteroaryl group containing one or more heteroatom selected from the group consisting of nitrogen atom, oxygen atom and sulfur atom.

Specific examples of the alkyl group include a linear, branched or cyclic alkyl group having from 1 to 30 carbon atoms, such as methyl group, ethyl group, propyl group, butyl group, pentyl group, hexyl group, heptyl group, octyl group, nonyl group, decyl group, undecyl group, dodecyl group, tridecyl group, hexadecyl group, octadecyl group, eicosyl group, isopropyl group, isobutyl group, sec-butyl group, tert-butyl group, isopentyl group, neopentyl group, 1-methylbutyl group, isohexyl group, 2-ethylhexyl group, 2-methylhexyl group, cyclohexyl group, cyclopentyl group, 1-adamantyl group and 2-norbornyl group.

Specific examples of the alkenyl group include a linear, branched or cyclic alkenyl group having from 1 to 30 carbon atoms, such as vinyl group, 1-propenyl group, 1-butenyl group, 1-methyl-1-propenyl group, 1-cyclopentenyl group and 1-cyclohexenyl group.

Specific examples of the alkynyl group include an alkynyl group having from 1 to 30 carbon atoms, such as ethynyl group, 1-propynyl group, 1-butynyl group and 1-octynyl group.

Examples of the aryl group include an aryl group where a condensed ring is formed by 1 to 4 benzene rings, and an aryl group where a condensed ring is formed by a benzene ring and an unsaturated 5-membered ring. Specific examples thereof include an aryl group having from 1 to 30 carbon atoms, such as phenyl group, naphthyl group, anthryl group, phenanthryl group, indenyl group, acenaphthenyl group, fluorenyl group and pyrenyl group.

Examples of the heteroaryl group containing one or more hetero atom selected from the group consisting of nitrogen atom, oxygen atom and sulfur atom include a heteroaryl group resulting from eliminating one hydrogen atom on a heteroaromatic ring containing one or more hetero atom selected from the group consisting of nitrogen atom, oxygen atom and sulfur atom. Specific examples of the heteroaromatic ring containing one or more hetero atom selected from the group consisting of nitrogen atom, oxygen atom and sulfur atom include pyrrole, furan, thiophene, pyrazole, imidazole, triazole, oxazole, isooxazole, oxadiazole, thiazole, thiadiazole, indole, carbazole, benzofuran, dibenzofuran, thianaphthene, dibenzothiophene, indazole benzimidazole, anthranyl, benzisooxazole, benzoxazole, benzothiazole, purine, pyridine, pyridazine, pyrimidine, pyrazine, triazine, quinoline, acridine, isoquinoline, phthalazine, quinazoline, quinoxaline, naphthylidine, phenanthroline and pteridine.

The hydrocarbon group having from 1 to 30 carbon atoms may be substituted by one or more arbitrary substituent. Examples of the substituent include monovalent non-metallic atom groups except for hydrogen, such as a halogen atom (e.g., —F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group and a conjugate base thereof, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and a conjugate base group thereof, an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, an N-acylsulfamoyl group and a conjugate base group thereof, N-alkylsulfonylsulfamoyl group (—$SO_2NHSO_2$(alkyl)) and a conjugate base group thereof, an N-arylsulfonylsulfamoyl group (—$SO_2NHSO_2$(aryl)) and a conjugate base group thereof, an N-alkylsulfonylcarbamoyl group (—$CONHSO_2$(alkyl)) and a conjugate base group thereof, an N-arylsulfonylcarbamoyl group (—$CONHSO_2$(aryl)) and a conjugate base group thereof, an alkoxysilyl group (—$Si(Oalkyl)_3$), an aryloxysilyl group (—$Si(Oaryl)_3$), a hydroxysilyl group (—$Si(OH)_3$) and conjugate base group thereof, a phosphono group (—$PO_3H_2$) and a conjugate base group thereof, a dialkylphosphono group (—$PO_3$(alkyl)$_2$), a diarylphosphono group (—$PO_3$(aryl)$_2$), an alkylarylphosphono group (—$PO_3$(alkyl)(aryl)), a monoalkylphosphono group (—$PO_3H$(alkyl)) and a conjugate base group thereof, a monoarylphosphono group (—$PO_3H$(aryl)) and a conjugate base group thereof, a phosphonooxy group (—$OPO_3H_2$) and a conjugate base group thereof, a dialkylphosphonooxy group (—$OPO_3$(alkyl)$_2$), a diarylphosphonooxy group (—$OPO_3$(aryl)$_2$), an alkylarylphosphonooxy group (—$OPO_3$(alkyl)(aryl)), a monoalkylphosphonooxy group (—$OPO_3H$(alkyl)) and a conjugate base group thereof, a monoarylphosphonooxy group (—$OPO_3H$(aryl)) and a conjugate base group thereof, a cyano group, a nitro group, an aryl group, an alkyl group, an alkenyl group and an alkynyl group.

Examples of the linking group represented by Y include a substituted or unsubstituted divalent hydrocarbon group having from 1 to 30 carbon atoms, which may be interrupted once or more by a functional group containing one or more hetero atom selected from the group consisting of oxygen atom, nitrogen atom and sulfur atom.

Ar is a heteroaryl group having one or more nitrogen atom and specific examples thereof include those resulting from eliminating one hydrogen atom on the carbon atom constituting a nitrogen-containing heteroaromatic ring and forming a monovalent group, such as pyrrole, pyridine, pyrazole, imidazole, triazole, tetrazole, isooxazole, oxazole, isothiazole, thiazole, thiadiazole, indole, carbazole, azaindole, indazole, benzimidazole, benzotriazole, benzisooxazole, benzoxazole, benzothiazole, purine, pyridazine, pyrimidine, pyrazine, triazine, quinoline, isoquinoline, acridine, phthalazine, quinazoline, quinoxaline, naphthyridine, phenanthroline and pteridine.

If desired, the polymer compound capable of forming a complex with aluminum for use in the present invention may be combined with one or more other copolymerization component to form a binary or greater copolymer. From the standpoint of imparting sufficiently high alkali developability to the interlayer, the copolymerization component preferably has an acid group. The acid group is preferably an acid group having an acid dissociation constant (pKa) of 7 or less, more preferably —COOH, —$SO_3H$, —$OSO_3H$, —$PO_3H_2$, —$OPO_3H_2$, —$CONHSO_2$— or —$SO_2NHSO_2$—. Specific examples of this copolymerization component include those described in JP-A-11-84674.

The content of the structural unit having a group capable of coordinating to aluminum in the copolymer can be freely selected according to the intended capability of the lithographic printing plate precursor. With a high content, good results are given in view of the press life, and with a low content, good scumming resistance is obtained. The content is preferably 10 mol % or more, more preferably 30 mol % or more, still more preferably 50 mol % or more. The main chain structure of the polymer is not particularly limited but preferably (1) acrylic resin, styrene-type resin or a copolymer thereof, (2) urethane resin, (3) polyester resin or (4) polyamide resin.

Among these, preferred in view of the press life and the synthesis aptitude is (1) acrylic resin, styrene-type resin or a copolymer thereof. The molecular weight can be also freely selected according to the intended capability of the lithographic printing plate precursor. With a low molecular weight, good results are given in view of the scumming resistance, and with a high molecular weight, a long press life can be obtained. The molecular weight is preferably from 2,000 to 1,000,000, more preferably from 5,000 to 200,000.

Specific preferred examples of the polymer capable of forming a complex with aluminum for use in the present invention are set forth below, however, the present invention is not limited thereto.

[Compounds]

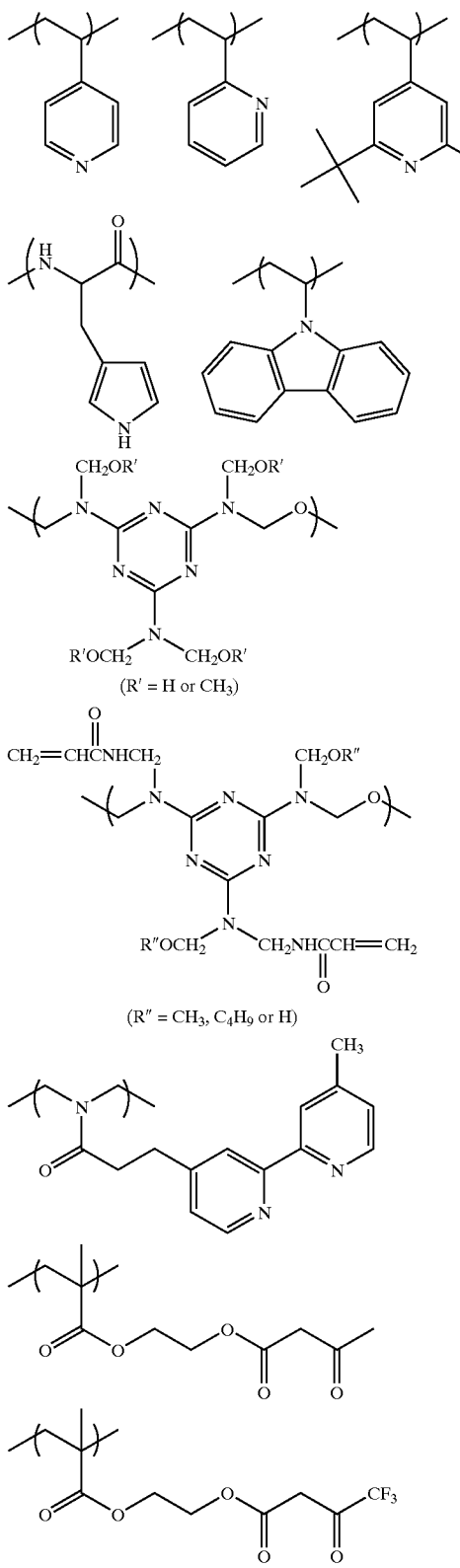

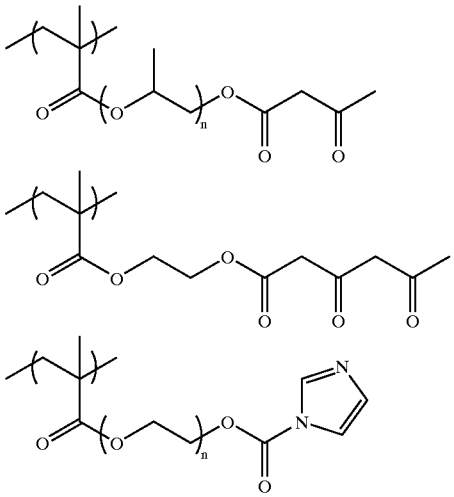

The compounds capable of forming an aluminum complex for use in the present invention may be used individually or in combination of two or more thereof.

The interlayer of the lithographic printing plate precursor of the present invention can be provided by the following method. A method of coating a solution obtained by dissolving the polymer having a cationic group and a radical reactive group in water, an organic solvent such as methanol or ethanol, or a mixed solvent thereof on an aluminum support subjected to a hydrophilization treatment and then drying it to provide an interlayer, and a method of dipping an aluminum support subjected to a hydro-philization treatment in a solution obtained by dissolving the polymer having a cationic group and a radical reactive group in water, an organic solvent such as methanol or ethanol, or a mixed solvent thereof to adsorb the polymer having a cationic group and a radical reactive group to the support, washing it with water or the like and drying it to provide an interlayer may be used. In the former method, a coating solution obtained by dissolving the polymer having a cationic group and radical reactive group in concentration of 0.005 to 10 wt % can be coated by various methods. For example, any method of bar coater coating, rotary coating, spray coating, curtain coating and the like may be used. In the method of dipping the support in a solution having dissolved therein the compounds of the present invention and then washing it with water or the like, the concentration of the solution is from 0.01 to 20 wt %, preferably from 0.05 to 5 wt %, the dipping temperature is from 20 to 90° C., preferably from 25 to 50° C., and the dipping time is from 0.1 second to 20 minutes, preferably from 2 seconds to 1 minute.

The dry coverage of the interlayer is suitably from 2 to 200 mg/m², preferably from 5 to 100 mg/m², more preferably from 5 to 50 mg/m².

If this coverage is less than 2 mg/m² or exceeds 200 mg/m², sufficiently high printing capability cannot be obtained.

The solution used at the time of providing the interlayer of the lithographic printing plate precursor of the present invention can used by adjusting the pH thereof using a basic substance such as ammonia, triethylamine and potassium hydroxide or an acidic substance such as hydrochloric acid, sulfuric acid, phosphoric acid, sulfonic acid and carboxylic acid to the range of 1 to 12. The adhesion can be more increased by providing the interlayer under acidic conditions or by previously treating the silicate with an acid and these are described in JP-A-7-314937 and JP-5-278362. In order to improve the tone reproducibility of the lithographic printing plate precursor, a yellow dye may also be added.

In the interlayer of the lithographic printing plate precursor of the present invention, a known compound may be mixed, for example, a phosphonic acid having an amino group, such as carboxymethyl cellulose, dextrin, gum arabic and 2-aminoethylphosphonic acid, an amino acid such as glycine and β-alanine, a hydrochloride of amine having a hydroxy group, such as hydrochloride of triethanolamine. The interlayer of the present invention preferably contains the polymer having a cationic group and a radical reactive group in an amount of 20 wt % or more, more preferably 50 wt % or more, most preferably 80 wt % or more.

The interlayer may also be a mixture with other components (e.g., binder polymer, photopolymerizable compound, photoinitiator) described in JP-A-9-34104 and JP-A-10-260536.

The portions other than the interlayer of the lithographic printing plate precursor of the present invention are described below.

<Photopolymerizable Photosensitive Layer>

In the lithographic printing plate precursor of the present invention, the photopolymerizable photosensitive layer (hereinafter sometimes simply referred to as "photosensitive layer") provided on the inter layer contains as essential components a photopolymerization initiator, a compound having an addition-polymerizable ethylenically unsaturated bond and a polymer binder, and if desired, contains various additives such as co-sensitizer, colorant, plasticizer and thermal polymerization inhibitor.

[(1) Addition-Polymerizable Compound]

The photopolymerizable photosensitive layer contains a compound having an addition polymerizable ethylenically unsaturated bond. The addition polymerizable compound having at least one ethylenically unsaturated double bond, which is used in the photosensitive layer of the lithographic printing plate precursor of the present invention is selected from the compounds having at least one, preferably two or more ethylenically unsaturated terminal bonds. Such compounds are widely known in this industrial field and those known compounds all can be used in the present invention without any limit. This compound has a chemical form of, for example, monomer, prepolymer, more specifically, dimer, trimer or oligomer, a mixture thereof or a copolymer thereof.

The addition polymerizable compound having at least one ethylenically unsaturated double bond, which is used in the photosensitive layer of the lithographic printing plate precursor of the present invention is selected from the compounds having at least one, preferably two or more ethylenically unsaturated bonds. Such compounds are widely known in this industrial field and those known compounds all can be used in the present invention without any limit. This compound has a chemical form of, for example, monomer, prepolymer, more specifically, dimer, trimer or oligomer, a mixture thereof or a copolymer thereof.

Examples of the monomer and its copolymer include unsaturated carboxylic acids (e.g., acrylic acid, methacrylic acid, itaconic acid), and esters and amides thereof. Among these, preferred are esters of an unsaturated carboxylic acid with an aliphatic polyhydric alcohol compound, and amides of an unsaturated carboxylic acid with an aliphatic polyhydric amine compound. Also, addition reaction products of an unsaturated carboxylic acid ester or amide having a nucleophilic substituent such as a hydroxyl group, an amino group or a mercapto group with a monofunctional or polyfunctional isocyanate or epoxy, and dehydration condensation reactants with a monofunctional or polyfunctional carboxylic acid are suitably used. Furthermore, addition reaction products of an unsaturated carboxylic acid ester or amide having a electrophilic substituent such as an isocyanate or an epoxy group with a monofunctional or polyfunctional alcohol, amine or thiol, and substitution reaction products of an unsaturated carboxylic acid ester or amide having a splitting-off substituent such as a halogen group or tosyloxy group with a monofunctional or polyfunctional alcohol, amine or thiol are also suitably used. In addition, the compounds where the above-described unsaturated compound is replaced by unsaturated phosphonic acid, styrene, vinyl ether or the like may also be used.

Specific examples of the ester monomer of an aliphatic polyhydric alcohol compound with an unsaturated carboxylic acid include acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetramethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate and polyester acrylate oligomer;

methacrylic acid esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetra-methacrylate, dipentaerythritol dimethacrylate, dipentaerythritol hexamethacrylate, sorbitol trimethacrylate, sorbitol tetramethacrylate, bis[p-(methacryloxy-2-hydroxypropoxy)phenyl]dimethylmethane and bis[p-(methacryloxyethoxy)phenyl]dimethylmethane; and itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate.

itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate;

crotonic acid esters such as ethylene glycol dicrotonate, tetramethylene glycol dicrotonate, pentaerythritol dicrotonate and sorbitol tetradicrotonate;

isocrotonic acid esters such as ethylene glycol diisocrotonate, pentaerythritol diisocrotonate and sorbitol tetraisocrotonate; and maleic acid esters such as ethylene glycol dimaleate, triethylene glycol dimaleate, pentaerythritol dimaleate and sorbitol tetramaleate.

Examples of other esters include aliphatic alcohol-base esters described in JP-B-46-27926 (the term "JP-B" as used herein means an "examined Japanese patent publication", JP-B-51-47334 and JP-A-57-196231, those having an aromatic-type skeleton described in JP-A-59-5240, JP-A-

59-5241 and JP-A-2-226149, and those containing an amino group described in JP-A-1-165613.

The above-described ester monomers may also be used as a mixture of two or more thereof.

Specific examples of the amide monomer of an aliphatic polyhydric amine compound with an unsaturated carboxylic acid include methylenebis-acrylamide, methylenebis-methacrylamide, 1,6-hexamethylenebis-acrylamide, 1,6-hexamethylenebis-methacrylamide, diethylenetriaminetris-acrylamide, xylylenebis-acrylamide and xylylenebis-methacrylamide.

Other preferred examples of the amide-type monomer include those having a cyclohexylene structure described in JP-B-54-21726.

A urethane-base addition polymerizable compounds produced by using an addition reaction of isocyanate and a hydroxyl group is also suitably used and specific examples thereof include vinyl urethane compounds having two or more polymerizable vinyl groups in one molecule described in JP-B-48-41708, which are obtained by adding a vinyl monomer having a hydroxyl group represented by the following formula (A) to a polyisocyanate compound having two or more isocyanate groups within one molecule:

$$CH_2=C(R^{14})COOCH_2CH(R^{15})OH \quad (A)$$

(wherein $R^{14}$ and $R^{15}$ each represents H or $CH_3$)

Also, urethane acrylates described in JP-A-51-37193, JP-B-2-32293 and JP-B-2-16765, and urethane compounds having an ethylene oxide-type skeleton described in JP-B-58-49860, JP-B-56-17654, JP-B-62-39417 and JP-B-62-39418 are also suitably used.

Furthermore, addition polymerizable compounds having an amino or sulfide structure within the molecule described in JP-A-63-277653, JP-A-63-260909 and JP-A-1-105238 may be used and by using such a compound, a photopolymerizable composition having a very excellent light sensitization speed can be obtained.

Other examples include polyfunctional acrylates and methacrylates such as polyester acrylates described in JP-A-48-64183, JP-B-49-43191 and JP-B-52-30490 and epoxy acrylates obtained by reacting an epoxy resin with a (meth) acrylic acid. In addition, specific unsaturated compounds described in JP-B-46-43946, JP-B-1-40337 and JP-B-1-40336, and vinyl phosphonic acid-base compounds described in JP-A-2-25493 may be used. Depending on the case, structures containing a perfluoroalkyl group described in JP-A-61-22048 are suitably used. Furthermore, those described as a photocurable monomer or oligomer in *Nippon Secchaku Kyokaishi* (*Journal of Japan Adhesive Society*), Vol. 20, No. 7, pp. 300–308 (1984) may also be used.

The structure, the use form, namely, sole use or combination use, the amount added and the details in use method of the addition polymerizable compound can be freely selected according to the intended capability of the final lithographic printing plate precursor. For example, the following points are taken account of. From the standpoint of light sensitization speed, structures having a large unsaturated group content per molecule are preferred and in many cases, bifunctional or greater functional compounds are preferred. In the case of increasing the strength of the image area, namely, cured film, trifunctional or greater functional compounds are preferred and a method of using the compound in combination with a different polymerizable group different in the function number (for example, an acrylic acid ester, a methacrylic acid ester, a styrene-base compound or a vinyl ether-base compound) to control both the sensitivity and the strength is also effective. The compounds having a large molecular weight or high hydrophobicity are excellent in the light sensitization speed or film strength but in some cases, these are disadvantageous in view of the development speed or because the compound precipitates in the developer. The selection and use method of the addition polymerizable compound affect the compatibility and dispersibility with other components (for example, binder, polymer, initiator, colorant and the like) in the photosensitive layer and these are important factors. For example, by using a low purity compound or using two or more compounds in combination, the compatibility is sometimes improved. for the purpose of improving the adhesive property of the above-described interlayer or the overcoat layer which is described later, a specific structure may be selected. A higher ratio of the addition polymerizable compound blended in the photosensitive layer is advantageous in view of the sensitivity, however, if the blended ratio is excessively high, there may arise problems, for example, phase separation takes place, troubles occur in the production process due to the tackiness of the photosensitive layer, or the compound precipitates from the developer. Therefore, in many cases, the blended ratio is preferably from 5 to 80 wt %, more preferably from 25 to 75 wt %, based on all components in the photosensitive layer composition. These may be used individually or in combination of two or more thereof. With respect to the use method of the addition polymerizable compound, appropriate structure, blending and amount added can be freely selected by taking account of the degree of polymerization inhibition to oxygen, the resolution, the fogging property, the change in refractive index, the surface tackiness and the like. Depending on the case, a layer structure and a coating method, such as undercoating and overcoating, may be employed.

[(2) Photopolymerization Initiator]

For the photopolymerization initiator, various photopolymerization initiators known in patents or publications or a combination system of two or more photopolymerization initiators (photopolymerization initiation system) may be selected and used according to the wavelength of the light source used.

In the case of using visible ray, Ar laser, second harmonic of semiconductor laser or SHG-YG laser as the light source, various photopolymerization initiators (initiation systems) have been proposed. Examples thereof include a system of using a combination of a certain kind of a photoreducing dye such as Rose Bengal, eosine and erythrosine, or a dye with an initiator described in U.S. Pat. No. 2,850,445, a composite initiation system, for example, of a dye and an amine (see, JP-B-44-20189), a combination system of hexaarylbiimidazole, a radical generating agent and a dye (see, JP-B-45-37377), a system of hexaarylbiimidazole and p-dialkylaminobenzylidene ketone (see, JP-B-47-2528, JP-A-54-155292), a system of a cyclic cis-a-dicarbonyl compound and a dye (see, JP-A-48-84183), a system of a cyclic triazine and-a merocyanine dye (see, JP-A-54-151024), a system of 3-ketocoumarin and an active agent (see, JP-A-52-112681 and JP-A-58-15503), a system of biimidazole, a styrene derivative and thiol (see, JP-A-59-140203), a system of an organic peroxide and a dye (see, JP-A-59-1504, JP-A-59-140203, JP-A-59-189340, JP-A-62-174203, JP-B-62-1641 and U.S. Pat. No. 4,766,055), a system of a dye and an active halogen compound (see, JP-A-63-1718105, JP-A-63-258903 and Japanese Patent Application No. 2-63054), a system of a dye and a borate compound (see, JP-A-62-143044, JP-A-62-150242, JP-A-64-13140, JP-A-64-13141, JP-A-64-13142, JP-A-64-13143, JP-A-64-13144, JP-A-64-17048, JP-A-1-229003, JP-A-1-

298348 and JP-A-1-138204), a system of a dye having a rhodanine ring and a radical generating agent (see, JP-A-2-179643 and JP-A-2-244050), a system of titanocene and a 3-ketocoumarin dye (see, JP-A-63-221110), a system of titanocene and a xanthene dye where an addition polymerizable ethylenically unsaturated compound containing an amino group or urethane group is further combined (see, JP-A-4-221958 and JP-A-4-219756), a system of titanocene and a specific merocyanine dye (see, JP-A-6-295061) and a system of titanocene and a dye having a benzopyran ring (see, JP-A-8-334897).

The photopolymerization initiator (initiation system) for use in the photosensitive layer of the lithographic printing plate precursor of the present invention preferably contains at least one titanocene.

The titanocene compound used as the photopolymerization initiator (initiation system) in the present invention may be any as long as it is a titanocene compound capable of generating an active radical under irradiation with light in the presence of other sensitizing dye together, and for example, known compounds described in JP-A-59-152396, JP-A-61-151197, JP-A-63-41483, JP-A-63-41484, JP-A-2-249, JP-A-2-241, JP-A-3-27393, JP-A-3-12403 and JP-A-6-41170 may be appropriately selected and used.

Specific examples thereof include dicyclopentadienyl-Ti-dichloride, dicyclopentadienyl-Ti-bisphenyl, dicyclopentadienyl-Ti-bis-2,3,4,5,6-pentafluorophen-1-yl (hereinafter sometimes referred to as "T-1"), dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-T-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl and bis(cyclopentadienyl)bis(2,6-difluoro-3-(pyr-1-yl)phenyl)titanium (hereinafter sometimes referred to as "T-2").

The titanocene compound may be subjected to various chemical modifications so -as to improve the properties of the photosensitive layer. Examples of the chemical modification which can be used include the methods such as bonding with a sensitizing dye, an addition polymerizable unsaturated compound or other radical-generating part, introduction of a hydrophilic site, introduction of a substituent to improve the compatibility or prevent the precipitation of crystal, introduction of a substituent capable of improving the adhesive property, and polymer formation.

Likewise the above-described addition polymerizable compound, the use method of the titanocene compound may also be appropriately and freely selected according to the intended capability of the lithographic printing plate precursor. For example, when two or more compounds are used, the compatibility with the photosensitive layer can be elevated. The titanocene compound is advantageously used in a large amount in view of the light sensitivity and by using it in an amount of 0.5 to 80 parts by weight, preferably from 1 to 50 parts by weight, per 100 parts of the components in the photosensitive layer, sufficiently high sensitivity can be obtained. On the other hand, in the case of use under a white lamp such as yellow, which is a principal object of the present invention, the titanocene is preferably used in a small amount in view of the fogging property due to light in -the vicinity of 500 nm, and by using titanocene in combination with other sensitizing dye, sufficiently high sensitivity can be obtained even if the amount used is reduced to 6 parts by weight or less, more reduced to 1.9 parts by weight or less, still more reduced to 1.4 parts by weight or less.

[(3) Polymer Binder]

The polymer binder (also called "binder polymer") for use in the photosensitive layer of the lithographic printing plate precursor of the present invention is preferably a linear organic high molecular polymer. The "linear organic high molecular polymer" may be any polymer. A water- or alkalescent water-soluble or swellable linear organic high molecular polymer capable of water development or alkalescent water development is preferably selected. The linear organic high molecular polymer is used not only as a film forming agent of the composition but also as a developer by appropriately selecting it according to the case where water, alkalescent water or organic solvent is used. For example, when a water-soluble organic high molecular polymer is used, water development can be performed. Examples of this linear organic high molecular polymer includes addition polymers having a carboxylic acid group on the side chain such as methacrylic acid copolymer, acrylic acid copolymer, itaconic acid copolymer, crotonic acid copolymer, maleic acid copolymer and partially esterified maleic acid copolymer, described in JP-A-59-44615, JP-B-54-34327, JP-B-58-12577, JP-B-54-25957, JP-A-54-92723, JP-A-59-53836 and JP-A-59-71048. Furthermore, acidic cellulose derivatives having a carboxylic acid group similarly on the side chain may be used. In addition, those obtained by adding a cyclic acid anhydride to an addition polymer having a hydroxyl group are also useful.

Among these, copolymers of [benzyl (meth)-acrylate/(meth)acrylic acid/other addition polymerizable vinyl monomer, if desired] and copolymers of [allyl (meth)acrylate/(meth)acrylic acid/other addition polymerizable vinyl monomer, if desired] are preferred because of good balance among film strength, sensitivity and developability.

The urethane-base binder polymers containing an acid group described in JP-B-7-12004, JP-B-7-120041, JP-B-7-120042, JP-B-8-12424, JP-A-63-287944, JP-A-63-287947, and JP-A-1-271741 have very excellent strength, therefore, these are advantageous in view of press life and low exposure suitability. Furthermore, the binder having an amide group described in Japanese Patent Application No. 9-363195 is preferred because it has both excellent developability and high film strength.

Other than these, polyvinyl pyrrolidone and polyethylene oxide are useful as the water-soluble linear organic polymer. For increasing the strength of the cured film, alcohol-soluble nylons and polyethers of 2,2-bis(4-hydroxyphenyl)propane with epichlorohydrin are also useful.

In the present invention, the most preferred binder has a cross-linking group (also called an "unsaturated group") and a carboxyl group on the side chain by itself, where the cross-linking group is represented by the following formula [II]:

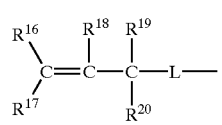

wherein $R^{16}$ to $R^{20}$ each is a group selected from hydrogen, halogeno, carboxyl, sulfo, nitro, cyano, amido, amino, and alkyl, aryl, alkoxy, aryloxy, alkylamino, arylamino, cyclic alkyl, alkylsulfonyl and arylsulfonyl which each may have a substituent, and L is selected from oxygen, sulfur, NH and $NR^{21}$ (wherein $R^{21}$ is an alkyl group).

In formula [II], the alkyl group represented by $R^{16}$ to $R^{20}$, which may be linear, branched or cyclic, is preferably an alkyl group having from 1 to 7 carbon atoms and the alkyl group may have a substituent such as an alkoxy group having 1 or 2 carbon atoms, an alkoxycarbonyl group having from 1 to 3 carbon atoms, a phenyl group or a hydroxy group. The aryl group represented by $R^{16}$ to $R^{20}$ is preferably a phenyl group or a furyl group, which may have a substituent such as a halogeno group (e.g., chloro, bromo), a hydroxyl group, an alkyl group having from 1 to 7 carbon atoms, an aryl group (e.g., phenyl, methoxyphenyl), an alkoxy group having from 1 to 7 carbon atoms, a nitro group, an amino group or an N,N-dialkylamino group. The alkoxy group represented by $R^{16}$ to $R^{20}$ is preferably an alkoxy group having from 1 to 7 carbon atoms, and the aryloxy group is preferably a phenyloxy group which may have a substituent such as an alkyl or alkoxy group having from 1 to 7 carbon atoms. The alkylamino group represented by $R^{16}$ to $R^{20}$ is preferably an alkylamino group having from 1 to 15 carbon atoms, and the arylamino group is preferably a phenylamino group or a naphthylamino group. The alkylsulfonyl group represented by $R^{16}$ to $R^{20}$ is preferably an alkylsulfonyl group having from 1 to 15 carbon atoms, and the arylsulfonyl group is preferably a phenylsulfonyl group which may have a substituent such as an alkyl group having from 1 to 15 carbon atoms, an alkoxy group having from 1 to 5 carbon toms or an amino group.

The polymer having a cross-linking group on the side chain used as binder in the photosensitive layer of the lithographic printing plate precursor of the present invention is known in U.S. Pat. Nos. 3,376,138, 3,556,792 and 3,556,793, where, however, the polymer itself is used as the photo-crbsslinking resist. Thus, the use method clearly differs from the present invention where the polymer is used as a binder of the composition for the photosensitive layer of the lithographic printing plate precursor.

The synthesis method of the polymer roughly includes the following two methods.

(Method A)

A method of causing a polymeric reaction of a trunk polymer having a carboxylic acid, a carboxylic acid halide or a carboxylic acid anhydride group as the side chain with a compound represented by the following formula [II-a]:

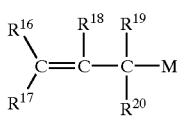

[II-a]

wherein $R^{16}$ to $R^{20}$ have the same meanings as in formula [II], and M represents OH, —SH, —NH$_2$, —NHR (wherein $R^{21}$ is an alkyl group) or a halogen atom, to introduce a cross-linking group represented by the following formula [II-b]:

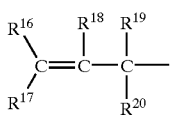

[II-b]

wherein $R^{16}$ to $R^{20}$ have the same meanings as defined in formula [II], through a linking group of —COO—, —COS—, —CONH— or —CONR$^{21}$— (wherein $R^{21}$ is an alkyl group).

(Method B)

A method of copolymerizing a monomer having a cross-linking group represented by formula [II] and an ethylenically unsaturated group abundant in the addition polymerization reactivity higher than the cross-linking group with an unsaturated carboxylic acid to obtain a polymer.

The method A is described in more detail. Examples of the trunk polymer include copolymers of an acrylic acid or a methacrylic acid, and copolymers obtained by forming the copolymer into an acid halide by the polymeric reaction. Also, copolymers of maleic acid anhydride, itaconic acid anhydride or the like may be used. Examples of the comonomer copolymerized include styrene and alkyl-substituted derivatives thereof, acrylic acid alkyl esters, acrylic acid aryl esters, methacrylic acid alkyl esters, methacrylic acid aryl esters and aliphatic vinyl esters. Preferred examples of the copolymer include copolymers of an acrylic or methacrylic acid with methyl acrylate, ethyl acrylate, butyl acrylate, -benzyl acrylate, methyl methacrylate, ethyl methacrylate, butyl methacrylate or benzyl methacrylate. The cross-linking group can be introduced into the copolymer by mixing and dissolving a cross-linking alcohol, amine, thiol or halide represented by formula [II-a] with the copolymer in a reaction solvent under predetermined reaction conditions, adding a reaction catalyst and a polymerization inhibitor, and heating the mixture. This is specifically described below by referring to a copolymer of methacrylic acid with benzyl methacrylate as an example.

Into a 300 ml-volume three-neck flask equipped with a stirring bar, a stirring blade, a reflux condenser and a thermometer, 19.8 g of poly(methacrylic acid/benzyl methacrylate) (27/73 by mol), 40.2 g of acetic acid ethylene glycol monomethyl ether as a reaction solvent, 6.0 g of allyl bromide as a reagent containing a cross-linking group, 10.4 g of trimethylbenzylammonium hydroxide as a catalyst and 0.01 g of paramethoxyphenol as a polymerization inhibitor were charged, mixed, dissolved and heated at 70° C. for 13 hours in a nitrogen atmosphere. After cooling, methyl ethyl ketone was added and free quaternary salts were removed. Furthermore, methanol was added to dilute the residue and the resulting solution was poured into diluted hydrochloric acid to cause precipitation. The precipitate was washed with water, filtered by suction and vacuum dried, as a result, a polymer obtained in a yield of 13.6 g. The allyl group is introduced in a ratio of 35% based on the carboxylic acid of the trunk polymer.

At this time, the viscosity at 30° C. in methyl ethyl ketone was [η]=0.161.

The synthesis of introducing the cross-linking group into a copolymer of maleic acid anhydride can be performed by the method described in U.S. Pat. No. 2,047,398, where an unsaturated ester, amide, thioester or the like with the maleic acid anhydride moiety being ring-opened is introduced. With respect to the method for introducing a cross-linking group into a maleic acid anhydride copolymer, JP-A-48-82902 describes a similar example, however, according to this method, the cross-linking group is bonded to the nitrogen atom of maleic acid imide, therefore, the compound clearly differs from the above-described polymer and can be differentiated from the polymer having a cross-linking group on the side chain for use in the present invention.

The method B is described in detail below. The monomer containing the cross-linking group and at least two or more carbon-carbon double bonds can be synthesized by a condensation reaction of an alcohol, amine or thiol having the cross-linking group with an unsaturated carboxylic acid, preferably an acrylic or methacrylic acid, according to a known synthesis method. By copolymerizing this monomer having two or more unsaturated groups with an unsaturated carboxylic acid, preferably an acrylic acid or methacrylic acid, a copolymer having the cross-linking group is obtained. The monomer copolymerized may be copolymerized, in addition to the unsaturated carboxylic acid, with another monomer and examples of this another monomer include alkyl acrylate, alkyl methacrylate, benzyl methacrylate, 2-hydroxyethyl methacrylate and acrylonitrile.

A copolymerization example of an allyl methacrylate with a methacrylic acid is described below. A similar synthesis method is described in U.S. Pat. No. 2,047,398.

Into a 3 l-volume four-neck flask equipped with a stirring bar, a stirring blade, a reflux condenser, a dropping funnel and a thermometer, 1.68 l of 1,2-dichloroethane as a reaction solvent was charged and heated at 70° C. while purging with nitrogen. Into the dropping funnel 100.8 g of allyl methacrylate, 7.6 g of methacrylic acid and 1.68 g of 2,2'-azobis(2,4-dimethylvaleronitrile) as a polymerization initiator, which were dissolved in 0.44 l of 1,2-dichloroethane, was charged and this mixture solution was dropped into the flask while stirring over 2 hours.

After the completion of dropping, the solution was stirred at a reaction temperature of 70° C. for 5 hours to compete the reaction. After the completion of the heating, 0.04 g of paramethoxyphenol as a polymerization inhibitor was added and the reaction solution was condensed to 500 ml. This condensed solution was added to 4 l of hexane, precipitated and then vacuum dried, as a result, 61 g (yield: 56%) of a copolymerized polymer was obtained. At this time, the viscosity at 30° C. in methyl ethyl ketone was $[\eta]=0.068$.

Representative examples of the compound represented by formula [II-a] include allyl alcohol, 2-methylallyl alcohol, crotyl alcohol, 3-chloro-2-propen-1-ol, 3-phenyl-2-propen-1-ol, 3-(hydroxyphenyl)-2-propen-1-ol, 3-(2-hydroxyphenyl)-2-propen-1-ol, 3-(3,4-dihydroxyphenyl)-2-propen-1-ol, 3-(2,4-dihydroxyphenyl)-2-propen-1-ol, 3-(3,4,5-trihydroxyphenyl)-2-propen-1-ol, 3-(3-methoxy-4-hydroxyphenyl)-2-propen-1-ol, 3-(3,4-dihydroxy-5-methoxyphenyl)-2-propen-1-ol, 3-(3,5-dimethoxy-4-hydroxyphenyl)-2-propen-1-ol, 3-(2-hydroxy-4-methylphenyl)-2-propen-1-ol, 3-(4-methoxyphenyl)-2-propen-1-ol, 3-(4-ethoxyphenyl)-2-propen-1-ol, 3-(2-methoxyphenyl)-2-propen-1-ol, 3-(3,4-dimethoxyphenyl)-2-propen-1-ol, 3-(3-methoxy-4-propoxyphenyl)-2-propen-1-ol, 3-(2,4,6-trimethoxyphenyl)-2-propen-1-ol, 3-(3-methoxy-4-benzyloxyphenyl)-2-propen-1-ol, 3-1-(3'-methoxyphenyl)-4-benzyloxyphenyl)-2-propen-1-ol, 3-phenoxy-3-phenyl-2-propen-1-ol, 3-(3,4,5-trimethoxyphenyl)-2-propen-1-ol, 3-(4-methylphenyl)-2-propen-1-ol, 3-phenyl-3-(2,4,6-trimethylphenyl)-2-propen-1-ol, 3,3-{di-(2,4,6-trimethylphenyl)}-2-propen-1-ol, 3-phenyl-3-(4-methylphenyl)-2-propen-1-ol, 3,3-diphenyl-2-propen-1-ol, 3-(2-chlorophenyl)-2-propen-1-ol, 3-(3-chlorophenyl)-2-propen-1-ol, 3-(4-chlorophenyl)-2-propen-1-ol, 3-(2,4-dichlorophenyl)-2-propen-1-ol, 3-(2-bromophenyl)-2-propen-1-ol, 3-bromo-3-phenyl-2-propen-1-ol, 3-chloro-3-phenyl-2-propen-1-ol, 3-(4-nitrophenyl)-2-propen-1-ol, 3-(2-nitrophenyl)-2-propen-1-ol, 3-(3-nitrophenyl)-2-propen-1-ol, 2-methyl-3-phenyl-2-propen-1-ol, 2-methyl-3-(4-chlorophenyl)-2-propen-1-ol, 2-methyl-3-(4-nitrophenyl)-2-propen-1-ol, 2-methyl-3-(4-aminophenyl)-2-propen-1-ol, 2-methyl-3,3-diphenyl-2-propen-1-ol, 2-ethyl-1,3-diphenyl-2-propen-1-ol, 2-ethoxymethylene-3-phenyl-2-propen-1-ol, 2-phenoxy-3-phenyl-2-propen-1-ol, 2-methyl-3-(4-methoxyphenyl)-2-propen-1 1-ol, 2,3-diphenyl-2-propen-1-ol, 1,2,3-triphenyl-2-propen-1-ol, 2,3,3-triphenyl-2-propen-1-ol, 2-ethoxy-3-phenyl-2-propen-1-ol, 1,3-diphenyl-2-propen-1-ol, 1-(4-methylphenyl)-3-phenyl-2-propen-1-ol, 1-phenyl-3-(4-methylphenyl)-2-propen-1-ol, 1-phenyl-3-(4-methoxyphenyl)-2-propen-1-ol, 1-(4-methoxyphenyl)-3-phenyl-2-propen-1-ol, 1,3-di(4-chlorophenyl)-2-propen-1-ol, 1-(4-bormophenyl)-3-phenyl-2-propen-1-ol, 1-phenyl-3-(4-nitrophenyl)-2-propen-1-ol, 1,3-di(2-nitrophenyl)-2-propen-1-ol, 1-(4-dimethylaminophenyl)-3-phenyl-2-propen-1-ol, 1-phenyl-3-(4-dimethylaminophenyl)-2-propen-1-ol, 1,1-di(4-dimethylaminophenyl)-3-phenyl-2-propen-1-ol, 1,1,3-triphenyl-2-propen-1-ol, 1,1,3,3-tetraphenyl-2-propen-1-ol, 1-(4-methylphenyl)-3-phenyl-2-propen-1-ol, 1-(dodecylsulfonyl)-3-phenyl-2-propen-1-ol, 1-phenyl-2-propen-1-ol, 1,2-diphenyl-2-propen-1-ol, 1-phenyl-2-methyl-2-propen-1-ol, 1-cyclohexyl-2-propen-1-ol, 1-phenoxy-2-propen-1-ol, 2-benzyl-2-propen-1-ol, 1,1-di(4-chlorophenyl)-2-propen-1-ol, 1-carboxy-2-propen-1-ol, 1-carboxyamido-2-propen-1-ol, 1-cyano-2-propen-1-ol, 1-sulfo-2-propen-1-ol, 2-ethoxy-2-propen-1-ol, 2-amino-2-propen-1-ol, 3-(3-amino-4-methoxyphenylsulfonyl)-2-propen-1-ol, 3-(4-methylphenylsulfonyl)-2-propen-1-ol, 3-phenylsulfonyl-2-propen-1-ol, 3-benzylsulfonyl-2-propen-1-ol, 3-anilinosulfonyl-2-propen-1-ol, 3-(4-methoxyanilinosulfonyl)-2-propen-1-ol, 3-anilino-2-propen-1-ol, 3-naphthylamino-2-propen-1-ol, 3-phenoxy-2-propen-1-ol, 3-(2-methylphenyl)-2-propen-1-ol, 3-(3-methylphenoxy)-2-propen-1-ol, 3-(2,4-dimethylphenyl)-2-propen-1-ol, 1-methyl-3-carboxy-2-propen-1-ol, 3-carboxy-2-propen-1-ol, 3-bromo-3-carboxy-2-propen-1-ol, 1-carboxy-3-chloro-3-methyl-2-propen-1-ol, 1-carboxy-3-methyl-2-propen-1-ol, 1-(2-carbethoxyisopropyl)-3-methyl-2-propene-1-ol, 1-(1-carbethoxypropyl)-2-propen-1-ol, 1-(1-carbethoxyethyl)-3-methyl-2-propen-1-ol, 1-carbethoxy-3-chloro-3-methyl-2-propen-1-ol, 1-carbethoxymethylene-3-methyl-2-propen-1-ol, 1-amido-2,3-dimethyl-2-propen-1-ol, 1-cyano-3-methyl-2-propen-1-ol, 3-sulfo-2-propen-1-ol, 3-butoxy-2-propen-1-ol, 1-cyclohexyl-3-(2-hydroxycyclohexyl)-2-propen-1-ol, 3-cyclobenzyl-2-propen-1-ol, 3-furyl-2-propen-1-ol, 3-chromo-2-propen-1-ol, 3-bromo-2-propen-1-ol, 2-methyl-3-chloro-2-propen-1-ol, 2-methyl-3-bromo-2-propen-1-ol, 1-carboisobutoxy-3-chloro-3-methyl-2-propen-1-ol, 2-chloro-3-phenyl-2-propen-1-ol (2-chlorocinnamyl alcohol), 2-bromo-3-phenyl-2-propen-1-ol (2-bromocinnamyl alcohol), 2-bromo-3-(4-nitrophenyl)-2-propen-1-ol, 2-fluoro-3-phenyl-2-propen-1-ol (2-fluorocinnamyl alcohol), 2-fluoro-3-(4-methoxyphenyl)-2-propen-1-ol, 2-nitro-3-chloro-3-phenyl-2-propen-1-ol, 2-nitro-3-phenyl-2-propen-1-ol (2-nitrocinnamyl alcohol), 2-cyano-3-phenyl-2-propen-1-ol (2-cyanocinnamyl alcohol), 2-chloro-2-propen-1-ol (2-chloroallyl alcohol), 2-bromo-2-propen-1-ol (2-bromoallyl alcohol), 2-carboxy-2-propen-1-ol (2-carboxyallyl alcohol), 2-carbethoxy-2-propen-1-ol (2-carbethoxyallyl alcohol), 2-sulfonic acid-2-propen-1-ol (2-sulfonic acid allyl alcohol), 2-nitro-2-propen-1-ol (2-nitroallyl alcohol), 2-bromo-3,3-difluoro-2-propen-1-ol, 2-chloro-3,3-difluoro-2-propen-1-ol, 2-fluoro-3-chloro-2-propen-1-ol, 2,3-dibromo-3-carboxy-2-propen-1-ol, 2,3-diiodo-3-carboxy-2-propen-1-ol, 2,3-dibromo-2-propen-1-ol and 2-chloro-3-methyl-2-propen-1-ol. Needless to say, in these specific examples, the compounds where the alcohol at the 1-position is substituted by a thioalcohol, amine or halogen may be also used.

The contents of respective cross-linking groups in the polymer are preferably, in terms of the copolymerization molar ratio, from 10 to 90 mol % and from 5 to 60 mol %, more preferably from 20 to 70 mol % and from 10 to 40 mol %.

The organic high molecular polymer may be mixed in the entire composition of the photosensitive layer components in any amount. However, if the amount mixed exceeds 90 wt %, disadvantageous results may be caused in view of the strength of an image formed and the like. The amount mixed is preferably from 10 to 90%, more preferably from 30 to 80%. The weight ratio of the photopolymerizable ethylenically unsaturated compound to the organic high molecular polymer is preferably from 1/9 to 9/1, more preferably from 2/8 to 8/2, still more preferably from 3/7 to 7/3.

The ratio of the acid value/molecular weight of the binder polymer greatly affects the image strength and the developability and in the present invention, the acid value is preferably from 0.4 to 1.6 meq/g, more preferably from 0.6 to 1.3 meq/g, and the molecular weight is preferably from 10,000 to 300,000, more preferably from 20,000 to 200,000.

The photosensitive layer of the lithographic printing plate precursor of the present invention may appropriately contain, in addition to the above-described basic components, other components suitable for the use end, the production method and the like. Examples of the preferred additives are described below.

[(4) Co-Sensitizer]

By using a co-sensitizer in the photosensitive layer of the lithographic printing plate precursor of the present invention, the sensitivity of the photosensitive layer can be more improved. The operation mechanism therefor is not clearly known, however, the following chemical process is estimated to greatly contribute thereto. That is, the co-sensitizer is considered to react with various intermediate active seeds (e.g., radical, peroxide, oxidizing agent, reducing gent) generated during the process of photochemical reaction initiated upon light absorption of the photopolymerization initiator (initiation system) and subsequent addition polymerization reaction, to generate new active radicals. The intermediate active seeds can be roughly classified into (a) those which are reduced to produce active radicals, (b) those which are oxidized to produce active radicals and (c) those which react with a low active radical to convert into a radical having higher activity or act as a chain transfer agent. However, there is not established a common view in many cases on the class to which individual compounds belong.

(a) Compounds Which are Reduced to Produce Active Radicals

Compounds having carbon-halogen bond:

The carbon-halogen bond is considered to reductively cleaved to thereby generate an active radical. Specifically, for example, trihalomethyl-s-triazines, trihlomethyloxadiazoles and the like can be suitably used.

Compounds having nitrogen-nitrogen bond:

The nitrogen-nitrogen bond is considered to reductively cleaved to thereby generate an active radical. Specifically, hexaarylbiimidazoles and the like can be suitably used.

Compounds having oxygen-oxygen bond:

The oxygen-oxygen bond is considered to reductively cleaved to thereby generate an active radical. Specifically, for example, organic peroxides and the like can be suitably used.

Onium compounds:

The carbon-hetero bond or oxygen-nitrogen bond is considered to. reductively—. cleave to thereby generate an active radical. Specifically, for example, diaryliodonium salts, triarylsulfonium salts, N-alkoxypyridinium (azinium) salts and the like can be suitably used. Ferrocene, iron arenes:

An active radical is reductively produced.

(b) Compounds Which are Oxidized to Produce Active Radicals

Alkyl-ate complexes:

The carbon-hetero bond is considered to oxidatively cleave to thereby produce an active radical. Specifically, for example, triarylalkyl borates can be suitably used.

Alkylamine compounds:

The C—X bond on the carbon adjacent to nitrogen is considered to cleave by the oxidation to thereby produce an active radical. X is suitably hydrogen tom, a carboxyl group, a trimethylsilyl group or a benzyl group. Specific examples of this compound include ethanolamines, N-phenylglycines and N-trimethylsilylmethylanilines.

Sulfur-containing or tin-containing compounds:

These compounds are resulting from the displacement of the nitrogen atom of the above-described amines by sulfur atom or tin atom, and an active radical is produced by the same action. Also, for the compounds having an S—S bond, sensitization due to the cleavage of S—S bond is known.

α-Substituted methylcarbonyl compounds:

By the oxidation, the bond between carbonyl-α carbon is cleaved and thereby an active radical is produced. The compounds where the carbonyl is converted into an oxime ether exhibit the same action. Specific examples include 2-alkyl-1-[4-(alkylthio)phenyl]2-morpholinopronone-1 compounds and oxime ethers obtained by reacting the compound with a hydroxyamine and etherifying the N—OH.

Sulfinates:

An active radical is reductively produced. Specific examples include sodium arylsulfinate.

(c) Compounds Which React With a Radical and Convert into a Highly Active Radial or Act as a Chain Transfer Agent:

Compounds having, for example, SH, PH, SiH or GeH within the molecule are used. These provide hydrogen to a low active radical seed to produce a radical or are oxidized and then remove the proton to produce a radical. Specific examples include 2-mercaptobenzimidazoles.

More specific examples of these co-sensitizers include a large number of compounds described as an additive for improving the sensitivity in JP-A-9-236913 and the like. Some of those compounds are set forth below, however, the co-sensitizer which can be used in the photosensitive layer of the lithographic printing plate precursor of the present invention is by no means limited thereto.

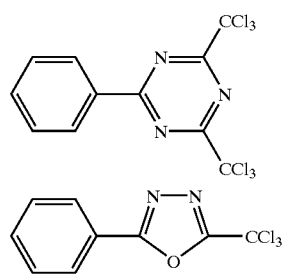

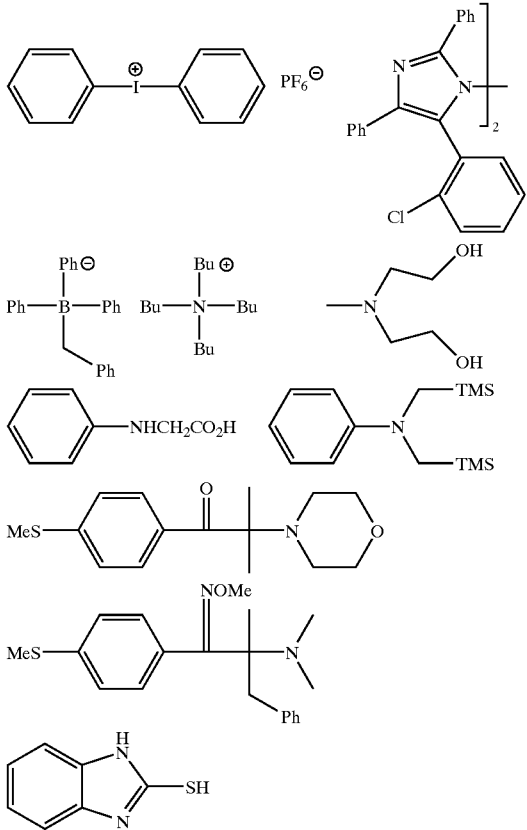

The co-sensitizer can also be subjected to various chemical modifications so as to improve the properties of the photosensitive layer. Examples of the chemical modification which can be used include the methods such as bonding with a sensitizing dye, titanocene, an addition polymerizable unsaturated compound or other radical-generating part, introduction of a hydrophilic site, introduction of a substituent to improve the compatibility or prevent the precipitation of crystal, introduction of a substituent capable of improving the adhesive property, and polymer formation.

These co-sensitizers can be used individually or in combination of two or more thereof. The amount of the co-sensitizer used is suitably from 0.05 to 100 parts by weight, preferably from 1 to 80 parts by weight, more preferably from 3 to 50 parts by weight, per 100 parts by weight of the compound having an ethylenically unsaturated double bond.

[(5) Polymerization Inhibitor]

In the photosensitive layer of the lithographic printing plate precursor of the present invention, a slight amount of a thermopolymerization inhibitor is preferably added so as to inhibit unnecessary thermopolymerization of the polymerizable compound having an ethylenically unsaturated double bond during preparation or storage of the photosensitive composition. Suitable examples of the thermopolymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol) and N-nitrosophenylhydroxyamine primary cerium salt. The amount of the thermopolymerization inhibitor added is preferably from about 0.01 wt % to about 5 wt % based on the weight of the entire composition. If desired, a higher fatty acid derivative such as behenic acid or behenic acid amide may be added and allowed to localize on the surface of the photosensitive layer in the process of drying after the coating, so as to prevent polymerization inhibition by oxygen. The amount of the higher fatty acid derivative added is preferably from about 0.5 to about 10 wt % based on the entire composition.

[(6) Colorant]

Furthermore, a dyestuff or a pigment may be added to the photosensitive layer for the purpose of coloring the photosensitive layer. By adding the colorant, so-called suitability for plate inspection, such as visibility after the plate-making or aptitude for image density measuring machine, can be improved. Many dyestuffs cause reduction in the sensitivity of a photopolymerization-system photosensitive layer, therefore, a pigment is preferably used as the colorant. Specific examples of the colorant include pigments such as phthalocyanine-type pigment, azo-type pigment, carbon black and titanium oxide, and dyestuffs such as Ethyl Violet, Crystal Violet, azo-type dye, anthraquinone-type dye and cyanine-type dye. The amount of the dyestuff or pigment added is preferably from about 0.5 to about 5 wt % based on the entire composition.

[(7) Other Additives]

In addition, in order to improve the physical properties of the cured film, an inorganic filler or other known additives such as plasticizer and ink receptivity agent capable of improving the inking property on the surface of the photosensitive layer may also be added.

Examples of the plasticizer include dioctyl phthalate, didodecyl phthalate, triethylene glycol dicaprylate, dimethyl glycol phthalate, tricresyl phosphate, dioctyl adipate, dibutyl sebacate and triacetyl glycerin, and when a binder is used, the plasticizer may be added in an amount of 10 wt % or less based on the total weight of the compound having an ethylenically unsaturated double bond and the binder.

Furthermore, for the purpose of improving the film strength (press life) which is described later, a UV initiator or a thermal cross-linking agent may also be added to intensify the effect of heating or exposure after the development.

In providing the photosensitive layer on the interlayer, a photopolymerizable composition containing the components for the photosensitive layer is dissolved in an organic solvent of various types and then coated on the interlayer. Examples of the solvent used here include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. These solvents may be used individually or in combination. The solid concentration in the coating solution is suitably from 2 to 50% by weight.

The coverage of the photosensitive layer has an effect mainly on the sensitivity and developability of the photosensitive layer and the strength and press life of the exposed film, therefore, an appropriate coverage is preferably selected according to the use. If the coverage is too small, a sufficiently long press life cannot be obtained, whereas if it is too large, the sensitivity decreases, the exposure takes a time and the development processing disadvantageously takes a long time. In the lithographic printing plate precursor for scan exposure, which is a principal object of the present invention, the coverage of the photosensitive layer is, in terms of the weight after drying, preferably from about 0.1 to about 10 g/m², more preferably from 0.5 to 5 g/m².

<Support>

For the support of the lithographic printing plate precursor of the present invention, conventionally known aluminum supports subjected to a hydrophilization treatment for use in lithographic printing plate precursors can be used without any limitation. The aluminum support used is preferably a dimensionally stable plate-like material and the aluminum plate is suitably a pure aluminum plate or an alloy plate mainly comprising aluminum and containing a slight amount. of dissimilar elements. Also, a plastic film laminated with or having evaporated thereon aluminum may be used. Examples of the dissimilar element contained in the aluminum alloy include silicon, iron, manganese, copper, magnesium, chromium, zinc, bismuth, nickel and titanium. The dissimilar element content in the alloy is 10 wt % or less. In the present invention, pure aluminum is preferred, however, it is difficult in view of the smelting technology to produce a completely pure aluminum and therefore, an aluminum containing a trace amount of dissimilar elements may be used. As such, the aluminum plate for use in the present invention cannot be specified about its composition and may be appropriately selected from the aluminum plates comprising conventionally known and commonly used materials. The aluminum plate for use in the present invention has a thickness of approximately from 0.1 to 0.6 mm, preferably from 0.15 to 0.4 mm, more preferably from 0.2 to 0.3 mm.

The aluminum support for use in the present invention is preferably subjected to a surface treatment such as surface roughening (graining) or anodic oxidation.

The surface roughening of the aluminum plate is performed by various methods, for example, by a method of mechanically roughening the surface, a method of electro-chemically dissolving and roughening the surface or a method of chemically dissolving the selected surface. In the mechanical surface roughening, a known method such as ball polishing, brush polishing, blast polishing or buff polishing may be used. The electrochemical surface roughening may be performed by passing an alternating current or direct current through the electrolytic solution suc h as hydrochloric acid or nitric acid. Both of these surface roughening treatments may be used in combination as disclosed in JP-A-54-63902. In advance of the surface roughening treatment of the aluminum plate, a degreasing treatment with, for example, a surfactant, an organic solvent or an alkaline aqueous solution may be performed, if desired, to remove the rolling oil on the surface. The anodic oxidation is performed by passing a current using the aluminum plate as an anode in an electrolytic solution comprising, for example, an aqueous or non-aqueous solution of an inorganic acid such as phosphoric acid, chromic acid, sulfuric acid or boric acid, or an organic acid such as oxalic acid or sulfamic acid. The surface treatment where the above-described anodic oxidation treatment is combined with a support subjected to electrolysis graining, disclosed in JP-B-46-27481, JP-A-52-58602 and JP-A-52-30503 is also effective. Furthermore, a support sequentially subjected to mechanical surface roughening, chemical etching, electrolysis graining and anodic ox idation disclosed in JP-A-56-28893 is also suitably used.

For the hydrophilization treatment of the support surface, various known methods may be used and among those, preferred is a method of hydrophilizing the support by silicate, polyvinyl phosphonic acid or the like. The film is formed using Si or P element in an amount of 2 to 40 mg/m², preferably from 4 to 30 mg/m².

The amount coated can be measured by the fluorescent X-ray analysis method.

In the above-described hydrophilization treatment, the aluminum substrate having formed hereon an anodic oxide film is dipped in an aqueous solution having a pH at 25° C. of 10 to 13 and containing the alkali metal silicate or polyvinyl phosphonic acid in an amount of 1 to 30 wt %, preferably from 2 to 15 wt %, for example, at a temperature of 15 to 80C for 0.5 to 120 seconds.

Examples of the alkali metal silicate for use in the hydrophilization treatment include sodium silicate, potassium silicate and lithium silicate. Examples of the hydroxide used for elevating the pH of the aqueous alkali metal silicate solution include sodium hydroxide, potassium hydroxide and lithium hydroxide.

In this processing solution, an alkaline earth metal salt or a Group IVB (or Group 4) metal salt may also be blended.

Examples of the alkaline earth metal salt include nitrates such as calcium nitrate, strontium nitrate, magnesium nitrate and barium nitrate, and water-soluble salts such as sulfate, hydrochloride, phosphate, acetate, oxalate and borate.

Examples of the Group IVB metal salt include titanium tetrachloride, titanium trichloride, potassium titanium fluoride, potassium titanium oxalate, titanium sulfate, titanium tetraiodide, zirconium chloride oxide, zirconium dioxide, zirconium oxychloride and zirconium tetrachloride.

The alkaline earth metal salts and the Group IVB metal salts may be used individually or in combination of two or more thereof. The metal salt is preferably used in an amount of 0.01 to 10 wt %, more preferably from 0.05 to 5.0 wt %.

The silicate electrodeposition described in U.S. Pat. No. 3,658,662 is also effective. Furthermore, the surface treatment where a support subjected to electrolysis graining is combined with the above-described anodic oxidation and hydrophilization treatment, disclosed in JP-B-46-27481, JP-A-52-58602 and JP-A-52-30503 is also effective.

<Protective Layer>

In a preferred embodiment of the lithographic printing plate precursor of the present invention, the exposure is usually performed in air, therefore, a protective layer is preferably further provided on the photosensitive layer. The protective layer prevents a low molecular compound such as oxygen or basic substance present in air, which inhibits the image formation reaction caused by the exposure in the photosensitive layer, from mixing into the photosensitive layer and thereby enables the exposure in air. To this purpose, the protective layer is required to have a low permeability to low molecular compounds such as oxygen. Furthermore, it is preferred that the protective layer does not substantially inhibit the transmittance of light used for the exposure, has excellent adhesion to the photosensitive layer and can be easily removed at the development after the exposure. Techniques for obtaining such a protective layer have heretofore been proposed and are described in detail, for example, in U.S. Pat. No. 3,458,311 and JP-A-55-49729. The material which can be used for the protective layer is preferably a water-soluble polymer compound having relatively excellent crystallinity. Specifically, water-soluble polymers such as polyvinyl alcohol, polyvinyl pyrrolidone, acidic celluloses, gelatin, gum arabi and polyacrylic acid are known. Among these, when polyvinyl alcohol is used as a main component, most preferred effects can be attained in view of the fundamental properties such as oxygen intercepting property or development separability. The polyvinyl alcohol for use in the protective layer has required oxygen intercepting property and water solubility, accordingly, as far as an unsubstituted vinyl alcohol unit is contained, the polyvinyl alcohol may be partially substituted by an ester, ether or acetal. Also, the polyvinyl alcohol may partially have another copolymer component. Examples of the polyvinyl alcohol include those hydrolyzed at a ratio of from 71 to 100% and having a molecular weight of 300 to 2,400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-22E, PVA-405, PVA-420, PVA-613 and L-8, all produced by Kuraray.

The components (selection of PVA, use of additives) and coated amount of the protective layer are selected by taking account of the oxygen intercepting property, development separability, fogging property, adhesion and scratch resistance. In general, as the hydrolysis ratio of PVA used (namely, the content of unsubstituted vinyl alcohol unit in the protective layer) is higher and the layer thickness is larger, the oxygen intercepting property is more intensified and this is advantageous in view of sensitivity. However, if the oxygen intercepting property is intensified to an extreme extent, an unnecessary polymerization reaction takes place during the production or stock storage or undesired fogging or thickening of the line image is disadvantageously caused. The adhesion to the image area and the scratch resistance are also very important in view of handling of the plate. More specifically, when a hydrophilic layer comprising a water-soluble polymer is laminated on the ink-receptive photosensitive layer, the coating is readily stripped off due to the insufficient adhesive strength and the area from which the coating is stripped causes faults such as curing failure due to polymerization inhibition by oxygen. To solve this problem, various proposals have been made with an attempt to improve the adhesive property between these, two layers. For example, U.S. Pat. No. 292,501 discloses a technique of mixing from 20 to 60 wt % of an acrylic emulsion or a water-insoluble vinyl pyrrolidone-vinyl acetate copolymer in a hydrophilic polymer mainly comprising polyvinyl alcohol and coating it on a photosensitive layer, thereby obtaining sufficiently high adhesive property. Any of these known techniques can be applied to the present invention. The coating method of such a protective layer is described in detail, for example, in U.S. Pat. No. 3,458,311 and JP-A-55-49729.

In the plate-making process for producing a lithographic printing plate from the lithographic printing plate precursor of the present invention, the entire surface may be heated, if desired, before or during the exposure or between the exposure and the development. This heating is advantageous in that the image formation reaction in the photosensitive layer is accelerated, the sensitivity and press life are improved, and the sensitivity is stabilized. Furthermore, for the purpose of improving the image strength and press life, it is effective to subject the entire surface of the developed image to post-heating or exposure. Usually, the heating before the development is preferably performed under a mild condition of 150° C. or less. If the temperature is excessively high, even the non-image area is disadvantageously fogged. The heating after the development uses a very severe condition of usually from 200 to 500° C. If the temperature is low, a sufficiently high effect of strengthening the image cannot be obtained, whereas if it is excessively high, there arise problems such as deterioration of the support or thermal decomposition of the image area.

For the exposure of the lithographic printing plate precursor of the present invention, known methods can be used without any limitation. The light source preferably has a wavelength of 350 to 650 nm, specifically, various laser light sources are suitably used. The exposure may be in any mechanism of inner surface drum system, outer surface drum system, flat bed system and the like. The components used for the photosensitive layer of the lithographic printing plate precursor of the present invention may have high water-solubility and by using such components, the photosensitive layer can be made soluble in neutral water or alkalescent water and also, the lithographic printing plate precursor having such a construction can be loaded in a printer and then exposed and developed under running.

Other examples of the light source which can be used in the exposure of the lithographic printing plate precursor of the present invention include an ultrahigh-pressure mercury lamp, a high-pressure mercury lamp, a medium-pressure mercury lamp, a low-pressure mercury lamp, a chemical lamp, a carbon arc lamp, a xenon lamp, a metal halide lamp, a visible or ultraviolet laser lamp of various types, a fluorescent lamp, a tungsten lamp and sunlight.

The lithographic printing plate precursor of the present invention is developed after the exposure.

The developer for use in the development is preferably an aqueous alkali solution having a pH of 14 or less, more preferably an aqueous alkali solution containing an anionic surfactant and having a pH of 8 to 12. For example, an inorganic alkali agent such as sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide, may be used. In addition, an organic alkali agent such as monomethylamine, dimethylamine, trimethylamine, monoethylamine, diethylamine, triethylamine, monoisoproylamine, diisopropylamine, triisopropylamine, n-butylamine, monoethanolamine, diethanolamine, triethanolamine, monoisopropanolamine, diisopropanolamine, ethyleneimine, ethylenediamine and pyridine, may also be used.

These alkali agents are used individually or in combination of two or more thereof.

In the development of the lithographic printing plate precursor of the present invention, an anionic surfactant is added to the developer in an amount of 1 to 20 wt %, preferably from 3 to 10 wt %. If the amount added is too small, the developability deteriorates, whereas if it is excessively large, the strength such as abrasion resistance of the image disadvantageously decreases.

Examples of the anionic surfactant include higher alcohol sulfates having from 8 to 22 carbon atoms, such as sodium salt of lauryl alcohol sulfate, ammonium salt of lauryl alcohol sulfate, sodium salt of octyl alcohol sulfate, alkyl aryl sulfonic acid salts (e.g., sodium salt of isopropylnaphthalene sulfonic acid, sodium salt of isobutylnaphthalenesulfonic acid, sodium salt of polyoxyethylene glycol mononaphthylether sulfate, sodium salt of dodecylbenzenesulfonic acid, sodium salt of metanitrobenzenesulfonic acid) and secondary sodium alkyl sulfate; aliphatic alcohol phosphate salts such as sodium salt of cetyl alcohol phosphate; sulfonic acid salts of alkylamide, such as $C_{17}H_{33}CON(CH_3)CH_2CH_2SO_3Na$; and sulfonic acid salts of dibasic aliphatic ester, such as sodium dioctyl sulfosuccinate and sodium dihexyl sulfosuccinate.

If desired, an organic solvent capable of mixing with water, such as benzyl alcohol, may be added to the developer. The organic developer suitably has a water solubility of about 10 wt % or less, preferably 5 wt % or less. Examples thereof include 1-phenylethanol, 2-phenylethanol, 3-phenylpropanol, 1,4-phenylbutanol, 2,2-phenylbutanol, 1,2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol and 3-methylcyclohexanol. The organic solvent content is suitably from 1 to 5 wt % based on the total weight of the developer on use. The amount used has close relationship with the amount of surfactant used and as the amount of the organic solvent is increased, the amount of the anionic surfactant is preferably increased, because if the organic solvent is used in a large amount in the state of the anionic surfactant being in a small amount, the organic solvent does not dissolve and good developability cannot be ensured.

Furthermore, if desired, additives such as defoaming agent and softening agent for hard water may be contained. Examples of the softening agent for hard water include polyphosphates such as $Na_2P_2O_7$, $Na_5P_3O_3$, $Na_3P_3O_9$, $Na_2O_4P(NaO_3P)PO_3Na_2$ and Calgon (sodium polymetaphosphate); aminopolycarboxylic acids such as ethylenediaminetetraacetic acid (including sodium and potassium salts thereof), diethylenetriaminepentaacetic acid (including sodium and potassium salts thereof), triethylenetetraminehexaacetic acid (including sodium and potassium salts thereof), hydroxyethylethylenediaminetriacetic acid (including sodium and potassium salts thereof), nitrilotriacetic acid (including sodium and potassium salts thereof), 1,2-diaminocyclohexanetetraacetic acid (including sodium and potassium salts thereof) and 1,3-diamino-2-propanol-tet raacetic acid (including sodium and potassium salts thereof); and organic phosphonic acids such as 2-phosphonobutanetricarboxylic acid-1,2,4 (including potassium and sodium salts thereof), 2-phosphonobutanonetricarboxylic acid-2,3,4 (including potassium and sodium salts thereof), 1-phosphonoethanetricarboxylic acid-1,2,2 (including potassium and sodium salts thereof), 1-hydroxyethane-1,1-diphosphonic acid (including potassium and sodium salts thereof) and aminotri (methylenephosphonic acid) (including potassium and sodium salts thereof). The optimal amount of the softening agent for hard water varies depending on the hardness and amount of the hard water used, but the softening agent is generally contained in an amount of 0.01 to 5 wt %, preferably from 0.01 to 0.5 wt %, based on the developer on use.

In the case of developing the lithographic printing plate precursor using an automatic developing machine, the developer becomes exhausted according to the amount processed, therefore, the processing ability thereof may be recovered using a replenisher or a fresh developer. In this case, the replenisher or fresh developer is preferably supplied by the method described in U.S. Pat. No. 4,882,246.

The developers described in JP-A-50-26601, JP-A-58-54341, JP-B-56-39464, JP-B-56-42860 and JP-B-57-7427 are also preferably used.

The developed lithographic printing plate precursor is after-treated with washing water, rinsing solution containing a surfactant and the like, and desensitizing solution containing gum arabic, starch derivative or the like. In the after-treatment of the lithographic printing plate precursor of the present invention, these treatments may be used in various combinations.

The lithographic printing plate obtained through such treatments is mounted on an off-set printer and subjected to printing a,large number of sheets.

For removing scumming on the plate at the printing, a plate cleaner is used and conventionally known plate cleaners for PS plates may be used. Examples thereof include CL-1, CL-2, CP, CN-4, CN, CG-1, PC-1, SR and IC (all produced by Fuji Photo Film Co., Ltd.).

EXAMPLES

The present invention is described in greater detail below by referring to the Examples, however, the present invention should not be construed as being limited to these Examples.

Synthesis Example 1, Method (1)-1

Into a 200 ml-volume three-neck flask equipped with a stirring bar, a stirring blade, a reflux condenser and a thermometer, 70 g of 2-methoxyethanol as a reaction solvent, 21.3 g of (4-vinylbenzyl)triethylammonium chloride and 8.3 g of 4-vinylbenzoic acid were charged, and the mixture was stirred at 50° C. for 30 minutes in a nitrogen atmosphere to form a uniform solution. Thereto, 1.04 g of 2,2'-azobis(2,4-dimethylvaleronitrile) as a polymerization initiator was added, and the mixture was stirred at 80° C. for 7 hours to perform the polymerization. The resulting solution was poured into 500 ml of ethyl acetate and the precipitate obtained was vacuum dried to obtain 29.5 g of a polymer having a cationic group and a reactive group. This polymer had an acid value of 1.85 meq/g.

Into a 300 ml-volume three-neck flask equipped with a stirring bar, a stirring blade, a reflux condenser and a thermometer, 150 g of methanol as a reaction solvent and 9.5 g of the polymer having a cationic group and a reactive group obtained above were charged and dissolved. Thereto, 1.3 g of glycidyl methacrylate was added and heated under reflux for 5 hours. The resulting solution was poured into 1,000 ml of ethyl acetate and the precipitate obtained was vacuum dried to obtain 10.1 g of Polymer (P-1) having a cationic group and a radical reactive group according to the present invention. This polymer had an acid value of 0.79 meq/g.

Synthesis Example 2, Method (1)-1

Into a 300 ml-volume three-neck flask equipped with a stirring bar, a stirring blade, a reflux condenser and a thermometer, 150 g of dimethylsulfoxide as a reaction solvent and 9.5 g of the polymer having a cationic group and a reactive group obtained in Synthesis Example 1 were charged and dissolved. Thereto, 1.4 g of 2-(methacryloyloxy)ethyl isocyanate and 3 drops of di-n-butyltin dilaurate were added and stirred under heating at 50° C. for 5 hours. The resulting solution was poured into 1,000 ml of ethyl acetate-and the precipitate obtained was vacuum dried to obtain 10.3 g of Polymer (P-2) having a cationic group and a radical reactive group according to the present invention. This polymer had an acid value of 0.84 meq/g.

Synthesis Example 3, Method (1)-2

Into a 200 ml-volume three-neck flask equipped with a stirring bar, a stirring blade, a reflux condenser and a thermometer, 150 g of methanol as a reaction solvent and 10.5 g of poly(4-vinylpyridine) (weight-average molecular weight: 20,000) were charged and dissolved. Thereto, 6.1 g of 4-(chloromethyl)styrene was added and heated under reflux for 8 hours. The resulting solution was poured into 8,000 ml of ethyl acetate and the precipitate obtained was vacuum dried to obtain 15.4 g of Polymer (P-3) having a cationic group and a radical reactive group according to the present invention.

Synthesis Example 4, Method (1)-2

Into a 200 ml-volume three-neck flask equipped with a stirring bar, a stirring blade, a reflux condenser and a thermometer, 50 g of methanol as a reaction solvent and 15.7 g of poly[(dimethylamino)ethyl methacrylate] (weight-average molecular weight: 78,000) were charged and dissolved. Thereto, 12.0 g of propargyl bromide was added and heated under reflux for 8 hours. The resulting solution was poured into 800 ml of ethyl acetate and the precipitate obtained was vacuum dried to obtain 21.3 g of Polymer (P-4) having a cationic group and a radical reactive group according to the present invention.

Synthesis Example 5, Method (1)-3

Into a 200 ml-volume three-neck flask equipped with a stirring bar, a stirring blade, a reflux condenser and a thermometer, 80 ml of methanol and 20 ml of acetone as reaction solvents and 7.6 g of poly(chloromethylstyrene) (weight-average molecular weight: 24,000) were charged and dissolved. Thereto, 1.6 g of 2-(dimethylamino)ethyl methacrylate was added and heated at 40° C. for 3 hours. Further, 6.6 g of N-n-butylamine was added thereto and heated at 40° C. for 3 hours. The resulting solution was poured into 500 ml of ethyl acetate and the precipitate obtained was vacuum dried to obtain 12.4 g of Polymer (P-5) having a cationic group and a radical reactive group according to the present invention.

Synthesis Example 6, Method (1)-4

Into a 200 ml-volume three-neck flask equipped with a stirring bar, a stirring blade, a reflux condenser and a thermometer, 90 g of 2-methoxyethanol as a reaction solvent, 17.7 g of [2-(methacryloyloxy)ethyl] trimethylammonium methyl sulfate (80 wt % aqueous solution), 3.8 g of allyl methacrylate and 1.7 g of methacrylic acid were charged and stirred at 50° C. for 30 minutes in a nitrogen stream to give a uniform solution. Thereto, 1.24 g of 2,2'-azobis(2,4-dimethylvaleronitrile) as a polymerization initiator was added and stirred at 80° C. for 8 hours to perform the polymerization. The resulting solution was poured into 1,000 ml of ethyl acetate and the precipitate obtained was vacuum dried to obtain 19.6 g of Polymer (P-6) having a cationic group and a radical reactive group according to the present invention. This polymer had an acid value of 0.96 meq/g.

Synthesis Example 7, Method (1)-5

Into a 200 ml-volume three-neck flask equipped with a stirring bar, a stirring blade, a reflux condenser and a thermometer, 50 g of N,N-dimethylacetamide as a reaction solvent and 12.0 g of (4-vinylbenzyl)triallylammonium hexafluorophosphate were charged and stirred at 50° C. for 30 minutes to give a uniform solution. Thereto, 0.15 g of 2,2'-azaobis(2,4-dimethylvaleronitrile) as a polymerization initiator was added and stirred at 80° C. for 7 hours to perform the polymerization. The resulting solution was poured into 1,000 ml of water and the precipitate obtained was vacuum dried to obtain 10.3 g of Polymer (P-7) having a cationic group and a radical reactive group according to the present invention.

Synthesis Example 1 to 6 and Comparative Examples 1 to 3

Lithographic printing plate precursors were manufactured according to the following procedure and evaluated on the printing capability. The results are shown in Table 2.

<Pre-Treatment of Support>

A 0.3 mm-thick aluminum plate (constructive material: 1S) was subjected to surface graining using a nylon blush No. 8 and a water suspension of 800-mesh pumice stone and then thoroughly washed with water. This plate was etched by dipping it in a 10 wt % sodium hydroxide at 70° C. for 60 seconds, washed with running water, neutralization washed with 20% nitric acid, and again washed with water. Thereafter, the plate was subjected to an electrolytic surface roughing treatment using a sine wave alternating electric current in a 1 wt % aqueous nitric acid solution with an anode time electricity of 300 coulombs/dm² under the condition of $V_A$=12.7 V. The surface roughness was measured and found to be 0.45 μm (Ra indication according to JIS B0601).

(Hydrophilization of Support Surface)

The support treated as above was dipped in an aqueous solution containing 2.5 wt % of sodium silicate No. 3 ($SiO_2$: 28 to 30%, $Na_2O$: 9 to 10%, Fe: 0.02% or less) at a pH of 11.2 and 70° C. for 13 seconds and then washed with water. From the amount of Si element determined by the fluorescent X-ray analysis of the surface, the surface silicate amount was found to be 10 mg/m².

(Coating of Interlayer)

A coating solution having a composition (A) or (B) shown below was prepared, coated on the surface of the hydrophilized support by a wheeler at 180 rpm such that the amount of non-volatile components coated was from 10 to 35 mg/m², and then dried at 80° C. for 30 seconds.

(Coating Solution A for Interlayer)

| | |
|---|---|
| Polymer having a cationic group and a radical reactive group according to the present invention synthesized in Synthesis Examples 1 to 7 (compound shown in Table 1 below) | 0.07 to 1.4 g |
| Additives (compounds shown in Table 1 below) (based on the polymer having a cationic group and a radical reactive group) | 2 to 100 wt % |
| Methanol | 200 g |

(Coating Solution B for Interlayer)

| | |
|---|---|
| Polymer having a cationic group and a radical reactive group according to the present invention synthesized in Synthesis Examples 1 to 7 (compound shown in Table 1 below) | 0.07 to 1.4 g |
| Additives (compounds shown in Table 1 below) (based on the polymer having a cationic group and a radical reactive group) | 20 to 100 wt % |
| Methanol | 100 g |
| Water | 100 g |

(Coating of Photosensitive Layer)

A photosensitive solution having the following composition was prepared, coated by a wheeler on the support having provided thereon the interlayer such that the coated amount of non-volatile components was from 1.0 to 2.0 g/m², and dried at 100° C. for 1 minute.

(Photosensitive Solution)

| | |
|---|---|
| Addition polymerizable compound (compound shown in Table 1) | 1.5 g |
| Binder polymer (compound shown in Table 1) | 2.0 g |
| Sensitizing dye (compound shown in Table 1) | 0.2 g |
| Photopolymerization initiator (compound shown in Table 1) | 0.4 g |
| Co-sensitizer (compound shown in Table 1) | 0.4 g |
| Coloring pigment dispersion (having the composition shown below) | 2.0 g |
| Thermal polymerization inhibitor (N-nitrosophenylhydroxylamine aluminum salt) | 0.01 g |
| Surfactant (Megafac F-177, produced by Dai-Nippon Ink & Chemicals, Inc.) | 0.02 g |
| Methyl ethyl ketone | 20.0 g |
| Polypropylene glycol monomethyl ether | 20.0 g |

Composition of the coloring pigment dispersion:

| | |
|---|---|
| Pigment Blue 15:6 | 15 parts by weight |
| Allyl methacrylate/methacrylic acid copolymer (copolymerization molar ratio: 83/17) | 10 parts by weight |
| Cyclohexane | 15 parts by weight |
| Methoxypropyl acetate | 20 parts by weight |
| Propylene glycol monomethyl ether | 40 parts by weight |

Coating of Protective Layer:

An aqueous solution containing 3 wt % of polyvinyl alcohol (saponification degree: 98 mol %, polymerization degree: 550) was coated on the photosensitive layer provided above to have a dry coated weight of 2 g/m², and then dried at 100° C. for 2 minutes.

Exposure of Lithographic Printing Plate precursor:

The thus-obtained lithographic printing plate precursor was subjected to a solid image exposure or a halftone image exposure (2540 dpi, 175 lines/inch, from 1 to 99% in units of 1%) using an FD-YAG (532 nm) laser exposing machine (Plate Setter: Gutenberg, manufactured by Heiderberg) by controlling the exposure power to give an exposure energy density of 200 µJ/cm² on the plate surface.

<Development/Plate -Making>

A predetermined developer and Finisher FP-2W produced by Fuji Photo Film Co., Ltd. were charged into an automatic developing machine LP-850 manufactured by Fuji Photo Film Co., Ltd., and the exposed plate was developed/processed for plate-making at a developer temperature of 30° C. for a development time of 18 seconds to obtain a lithographic printing plate.

<Press Life Test>

Using a printer R201 manufactured by Rholand and an ink GEOS-G(N) produced by Dai-Nippon Ink & Chemicals, Inc., the test was performed. The printed matter of the solid image area was observed and the press life was evaluated by the number of sheets when the image began thinning. A larger numeral reveals a longer press life.

<Forced Test of Press Life of Halftone Area>

Using a printer R201 manufactured by Rholand and an ink GEOS-G(N) produced by Dai-Nippon Ink & Chemicals, Inc., the test was performed. At the 5,000th sheet from the initiation of printing, the halftone area was wiped off with a printing sponge impregnated with PS plate cleaner CL-2 produced by Fuji Photo Film Col., Ltd. to wash the ink on the plate surface. Thereafter, 10,000 sheets were printed and the presence or absence of the plate slipping in the halftone area on the printed matter was observed with an eye.

<Scumming Resistance Test>

Using a printer R201 manufactured by Rholand and an ink GEOS-G(S) produced by Dai-Nippon Ink & Chemicals, Inc., the test was performed. The non-image area of the printed matter was observed and the scumming resistance was evaluated.

TABLE 1

| | Interlayer | | | | Photosensitive Layer | | | | | | |
|---|---|---|---|---|---|---|---|---|---|---|---|
| | Polymer (amount used) | Additive | Coating Solution composition | Amount of Non-volatile Component coated (mg/m²) | Addition Polymerizable Compound | Binder Polymer | Photo-initiator | Sensitizing Dye | Co-Sensitizer | Amount of Non-volatile Component Added (g/m²) | Developer Composition |
| Example | | | | | | | | | | | |
| 1 | P-1 (0.5 g) | none | A | 20 | M-1 | B-1 | I-1 | S-1 | C-1 | 1.5 | D-1 |
| 2 | P-1 (0.87 g) | 4-methoxy-phenol (2 wt %) | A | 35 | M-2 | B-1 | I-1 | S-1 | C-1 | 2.0 | D-1 |
| 3 | P-2 (0.25 g) | none | A | 10 | M-1 | B-1 | I-1 | S-2 | C-2 | 1.8 | D-2 |
| 4 | P-2 (0.75 g) | none | A | 30 | M-1 | B-1 | I-2 | S-1 | C-3 | 1.5 | D-2 |
| 6 | P-3 (0.45 g) | polyacrylic acid*[1] (10 wt %) | B | 20 | M-2 | B-3 | I-1 | S-1 | C-3 | 2.0 | D-2 |

TABLE 1-continued

| | | Interlayer | | | Photosensitive Layer | | | | | | | |
|---|---|---|---|---|---|---|---|---|---|---|---|---|
| | Polymer (amount used) | Additive | Coating Solution composition | Amount of Non-volatile Component coated (mg/m²) | Addition Polymerizable Compound | Binder Polymer | Photo-initiator | Sensitizing Dye | Co-Sensitizer | Amount of Non-volatile Component Added (g/m²) | Developer Composition |
| Comparative Example | | | | | | | | | | | |
| 1 | R-1 (0.5 g) | none | B | 20 | M-1 | B-1 | I-1 | S-1 | C-1 | 2.0 | D-1 |
| 2 | R-2 (0.4 g) | triethyl- | B | 20 | M-1 | B-1 | I-1 | S-2 | C-1 | 2.0 | D-1 |
| 3 | R-2 (0.75 g) | none | B | 30 | M-2 | B-1 | I-1 | S-1 | C-2 | 2.0 | D-1 |

*¹average polymerization degree: about 25,000

TABLE 2

| | | Printing Performance | | |
|---|---|---|---|---|
| | | Press Life of Image Area (sheets) | Press Life of Halftone Area | Scumming Resistance of Non-Image Area |
| Example | 1 | 160,000 | good | good |
| | 2 | 120,000 | good | very good |
| | 3 | 150,000 | good | very good |
| | 4 | 200,000 | good | good |
| | 5 | 160,000 | good | very good |
| | 6 | 220,000 | good | very good |
| Comparative Example | 1 | 5,000 | plate slipping | good |
| | 2 | 2,000 | plate slipping | very good |
| | 3 | 80,000 | plate slipping | good |

Example 7 to 15 and Comparative Example 4 to 6

Lithographic printing plate precursor shown in Table 3 were evaluated on the capability in the same manner as in Examples 1 to 6.

TABLE 3

| | | Interlayer | | | | Photosensitive Layer | | | | | | | |
|---|---|---|---|---|---|---|---|---|---|---|---|---|---|
| | Polymer (amount used) | Additive | Coating Solution composition | Amount of Non-volatile Component coated (mg/m²) | Addition Polymerizable Compound | Binder Polymer | Photo-initiator | Sensitizing Dye | Co-Sensitizer | Amount of Non-volatile Component Added (g/m²) | Developer Composition |
| Example | | | | | | | | | | | |
| 7 | P-4 (0.5 g) | none | B | 20 | M-1 | B-1 | I-1 | S-1 | C-1 | 1.5 | D-1 |
| 8 | P-4 (0.45 g) | C-2 (10 wt %) | B | 20 | M-2 | B-1 | I-1 | S-1 | C-1 | 2.0 | D-1 |
| 9 | P-5 (0.25 g) | none | A | 10 | M-2 | B-1 | I-1 | S-1 | C-2 | 2.0 | D-1 |
| 10 | P-5 (0.37 g) | benzoquinone (3 wt %) | A | 15 | M-1 | B-3 | I-1 | S-2 | C-2 | 1.8 | D-2 |
| 11 | P-5 (0.28 g) | ammonium tetraethyl nitrate (10 wt %) | A | 10 | M-1 | B-3 | I-2 | S-2 | C-3 | 1.5 | D-2 |
| 12 | P-6 (0.25 g) | none | B | 10 | M-2 | B-2 | I-2 | S-1 | C-3 | 1.5 | D-2 |
| 13 | P-6 (0.38 g) | M-1 (30 wt %) | A | 20 | M-2 | B-2 | I-2 | S-1 | C-3 | 2.0 | D-2 |
| 14 | P-7 (0.63 g) | none | A | 25 | M-1 | B-2 | I-1 | S-1 | C-3 | 2.0 | D-2 |
| 15 | P-7 (0.42 g) | benzene-sulfonic acid (50 wt %) | B | 25 | M-1 | B-2 | I-1 | S-1 | C-3 | 2.0 | D-2 |

TABLE 3-continued

| | Interlayer | | | | Photosensitive Layer | | | | | | |
|---|---|---|---|---|---|---|---|---|---|---|---|
| | Polymer (amount used) | Additive | Coating Solution composition | Amount of Non-volatile Component coated (mg/m$^2$) | Addition Polymer-izable Compound | Binder Polymer | Photo-initiator | Sensitiz-ing Dye | Co-Sensi-tizer | Amount of Non-volatile Component Added (g/m$^2$) | Developer Composi-tion |
| Comparative Example | | | | | | | | | | | |
| 4 | R-1 (0.42 g) | M-1 (20 wt %) | B | 20 | M-1 | B-1 | I-1 | S-1 | C-1 | 2.0 | D-1 |
| 5 | R-2 (0.4 g) | none | A | 20 | M-1 | B-3 | I-1 | S-2 | C-3 | 2.0 | D-2 |
| 6 | R-2 (0.75 g) | C-1 (10 wt %) | A | 20 | M-1 | B-3 | I-1 | S-2 | C-3 | 2.0 | D-1 |

TABLE 4

| | | Printing Performance | | |
|---|---|---|---|---|
| | | Press Life of Image Area (sheets) | Press Life of Halftone Area | Scumming Resistance of Non-Image Area |
| Example | 7 | 160,000 | good | very good |
| | 8 | 180,000 | good | very good |
| | 9 | 250,000 | good | good |
| | 10 | 160,000 | good | very good |
| | 11 | 170,000 | good | good |
| | 12 | 150,000 | good | very good |
| | 13 | 170,000 | good | very good |
| | 14 | 130,000 | good | very good |
| | 15 | 120,000 | good | very good |
| Comparative Example | 4 | 40,000 | plate slipping | good |
| | 5 | 40,000 | good | slightly scummed |
| | 6 | 60,000 | good | scummed |

As is apparent from Tables 2 and 4, the lithographic printing plate precursor where an interlayer containing a polymer having a cationic group and a radical reactive group was provided was verified to ensure very excellent press life and scumming resistance.

The compounds described in Tables 1 and 3 are shown below.

(R-1)

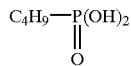

(R-2) (Polymer M, produced by Uni-Chemical K.K.)

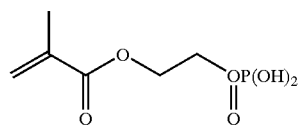

(R-3) (poly(vinylphosphonic acid))

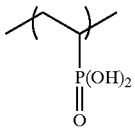

[Addition Polymerizable Compounds in Tables 1 and 3]

(M-1)

Pentaerythritol tetraacrylate (NK Ester A-TMMT, produced by Shin Nakamura Kagaku Kogyo K.K.)

(M-2)

Glycerin dimethacrylate hexamethylene diisocyanate urethane prepolymer (UA101H, produced by Kyoeisha Kagaku K.K.)

[Materials for Photopolymerization Initiators in Tables 1 and 3]

I-1

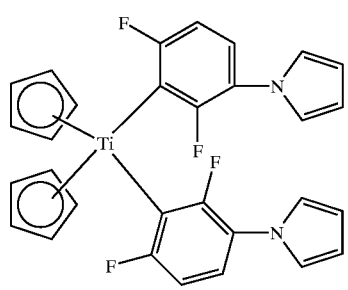

I-2

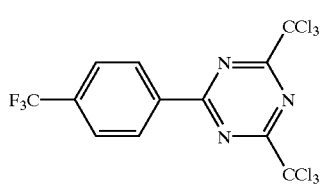

-continued

S-1
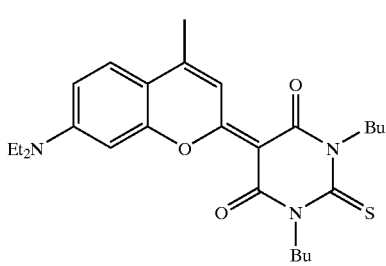

S-2
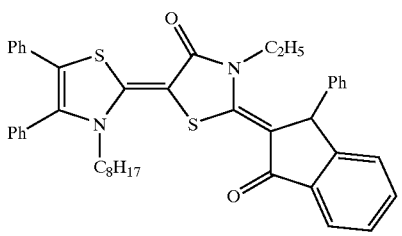

C-1
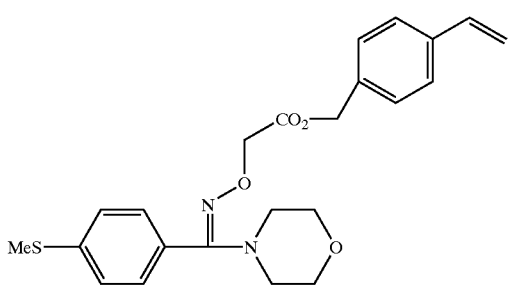

C-2
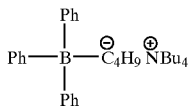

C-3
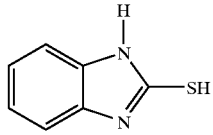

[Binder Polymers in Tables 1 and 3]

(B-1)

Allyl methacrylate/methacrylic acid/N-isopropylacrylamide (copolymerization molar ratio: 67/13/20)

Actual acid value determined by NaOH titration: 1.15 meq/g

Weight-average molecular weight determined by GPC: 130,000

(B-2)

Allyl methacrylate/methacrylic acid copolymer (copolymerization molar ratio: 83/17)

Actual acid value determined by NaOH titration: 1.55 meq/g

Weight-average molecular weight determined by GPC: 125,000

(B-3)

Polyurethane resin as a condensation polymerized product of the following diisocyanate and diol:

4,4'-diphenylmethane diisocyanate (MDI),
hexamethylene diisocyanate (HMDI),
polypropylene glycol (weight-average molecular weight: 1,000) (PPG1000), and
2,2-bis(hydroxymethyl)propionic acid (DMPA)

copolymerization molar ratio (MDI/HMDI/PPG1000/DMPA): 40/10/15/35

Actual acid value determined by NaOH titration: 1.05 meq/g

Weight-average molecular weight determined by GPC: 45,000

[Developer in Tables 1 and 3]

(D-1)

An aqueous solution having a pH of 10 comprising the following composition:

| | |
|---|---|
| Monoethanolamine | 0.1 part by weight |
| Triethanolamine | 1.5 parts by weight |
| Compound of formula 1 shown below | 4.0 parts by weight |
| Compound of formula 2 shown below | 2.5 parts by weight |
| Compound of formula 3 shown below | 0.2 part by weight |
| Water | 91.7 parts by weight |

(Formula 1)
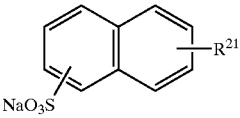

(Formula 2)
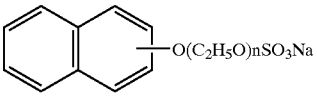

(Formula 3)
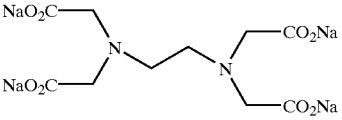

In (formula 1) above, $R^{21}$ represents hydrogen atom or a butyl group.

(D-2)

An aqueous solution comprising the following composition

| | |
|---|---|
| 1K Potassium silicate | 3.0 parts by weight |
| Potassium hydroxide | 1.5 parts by weight |
| Compound of formula 3 above: | 0.2 part by weight |
| Water | 95.3 parts by weight |

Examples 1' to 7' and Comparative Examples 1' to 3'

Lithographic printing plate precursors were manufactured according to the following procedure and evaluated on the printing capability. The results are shown in Table 1'.

Pre-Treatment of Support:

A 0.3 mm-thick aluminum plate (constructive material: 1S) was subjected to surface graining using a nylon blush No. 8 and a water suspension of 800-mesh pumice stone and then thoroughly washed with water. This plate was etched by dipping it in a 10 wt % sodium hydroxide at 70° C. for 60 seconds, washed with running water, neutralization washed with 20% nitric acid, and again washed with water. Thereafter, the plate was subjected to an electrolytic surface roughing treatment using a sine wave alternating electric current in a 1 wt % aqueous nitric acid solution with an anode time electricity of 300 coulombs/dm$^2$ under the condition of VA =12.7 V. The surface roughness was measured and found to be 0.45 μm (Ra indication according to JIS B0601). This support was designated as AS-1.

Hydrophilization of Support Surface:

The support treated as above was dipped in an aqueous solution containing 2.5 wt % of sodium silicate No. 3 (SiO$_2$: 28 to 30%, Na$_2$O: 9 to 10%, Fe: 0.02% or less) at a pH of 11.2 and 70° C. for 13 seconds and then washed with water. From the amount of Si element determined by the fluorescent X-ray analysis of the surface, the surface silicate amount was found to be 10 mg/m$^2$. This support was designated as AS-2.

Coating of Interlayer:

A coating solution having a composition (A) or (B) shown below was prepared, coated on the surface of the support prepared above by a wheeler to have a dry coated weight of from 10 to 35 mg/M$^2$, and then dried at 80° C. for 30 seconds.

(Coating Solution A for Interlayer)

| | |
|---|---|
| Compound capable of forming a complex with aluminum (compound shown in Table 1' below) | 0.75 g |
| Additives (compounds shown in Table 1' below) based on the compound capable of a complex with aluminum | 20 to 100 wt % |
| Methanol | 200 g |

(Coating Solution B for Interlayer)

| | |
|---|---|
| Compound capable of forming a complex with aluminum (compound shown in Table 1' below) | 0.75 g |
| Additives (compounds shown in Table 1' below) based on the compound capable of forming a complex with aluminum | 20 to 100 wt % |
| Methanol | 100 g |
| Water | 100 g |

(Coating Solution C for Interlayer)

| | |
|---|---|
| Compound capable of forming a complex with aluminum (compound shown in Table 1' below) | 0.75 g |
| Additives (compounds shown in Table 1' below) based on the compound capable of forming a complex with aluminum | 20 to 100 wt % |
| Methanol | 100 g |
| Acetonitrile | 100 g |

Coating of Photosensitive Layer:

A photosensitive solution having the following composition was coated by a wheeler on the support having provided thereon the interlayer to have a dry coated weight of 1.0 to 2.0 g/m$^2$, and then dried at 100° C. for 1 minute.

(Photosensitive Solution)

| | |
|---|---|
| Addition polymerizable compound (compound shown in Table 1') | 1.5 g |
| Binder polymer (compound shown in Table 1') | 2.0 g |
| Sensitizing dye (compound shown in Table 1') | 0.2 g |
| Photopolymerization initiator (compound shown in Table 1') | 0.4 g |
| Co-sensitizer (compound shown in Table 1') | 0.4 g |
| Coloring pigment dispersion (having the composition shown below) | 2.0 g |
| Thermal polymerization inhibitor (N-nitrosophenylhydroxylamine aluminum salt) | 0.01 g |
| Surfactant (Megafac F-177, produced by Dai-Nippon Ink & Chemicals, Inc.) | 0.02 g |
| Methyl ethyl ketone | 20.0 g |
| Polypropylene glycol monomethyl ether | 20.0 g |

Composition of the coloring pigment dispersion:

| | |
|---|---|
| Pigment Blue 15:6 | 15 parts by weight |
| Allyl methacrylate/methacrylic acid copolymer (copolymerization molar ratio: 83/17) | 10 parts by weight |
| Cyclohexane | 15 parts by weight |
| Methoxypropyl acetate | 20 parts by weight |
| Propylene glycol monomethyl ether | 40 parts by weight |

Coating of Protective Layer:

An aqueous solution containing 3 wt % of polyvinyl alcohol (saponification degree: 98 mol %, polymerization degree: 550) was coated on the photosensitive layer provided above to have a dry coated weight of 2 g/m$^2$, and then dried at 100° C. for 2 minutes.

Exposure of Lithographic Printing Plate precursor:

The thus-obtained lithographic printing plate precursor was subjected to a solid image exposure or a halftone image exposure (2540 dpi, 175 lines/inch, from 1 to 99% in units of 1%) using an FD-YAG (532 nm) laser exposing machine (Plate Setter: Gutenberg, manufactured by Heiderberg) by controlling the exposure power to give an exposure energy density of 200 μJ/cm$^2$ on the plate surface.

Development/Plate-Making:

A predetermined developer and Finisher FP-2W produced by Fuji Photo Film Co., Ltd. were charged into an automatic developing machine FLP-813 manufactured by Fuji Photo Film Co., Ltd., and the exposed plate was developed/processed for plate-making at a developer temperature of 30° C. for a development time of 18 seconds to obtain a lithographic printing plate.

Press Life Test:

Using a printer R201 manufactured by Rholand and an ink GEOS-G(N) produced by Dai-Nippon Ink & Chemicals, Inc., the test was performed. The printed matter of the solid image area was observed and the press life was evaluated by the number of sheets when the image began thinning. A larger numeral reveals a longer press life.

Forced Test of Press Life of Halftone Area:

Using a printer R201 manufactured by Rholand and an ink GEOS-G(N) produced by Dai-Nippon Ink & Chemicals, Inc., the test was performed. At the 5,000th sheet from the initiation of printing, the halftone area was wiped off with a printing sponge impregnated with PS plate cleaner CL-2 produced by Fuji Photo Film Co., Ltd. to wash the ink on the plate surface. Thereafter, 10,000 sheets were printed and the presence or absence of the plate slipping in the halftone area on the printed matter was observed with an eye.

Scumming Resistance Test:

Using a printer R201 manufactured by Rholand and an ink GEOS-G(S) produced by Dai-Nippon Ink & Chemicals, Inc., the test was performed. The non-image area of the printed matter was observed and the scumming resistance was evaluated.

TABLE 1'

| | | Interlayer | | | |
|---|---|---|---|---|---|
| No. | Support | Compound Capable of Complex with Al | Additive | Coating solution composition | Dry Coated Weight (mg/m$^2$) |
| Example 1' | AS-2 | P-1 | none | A | 20 |
| Example 2' | AS-1 | P-2 | potassium hydroxide (90 wt %) | A | 35 |
| Example 3' | AS-1 | P-3 | none | A | 10 |
| Example 4' | AS-2 | P-3 | B-2 (100 wt %) | C | 25 |
| Example 5' | AS-2 | P-4 | none | B | 10 |
| Example 6' | AS-2 | P-5 | none | B | 25 |
| Example 7' | AS-1 | P-5 | triethylamine (140 wt %) | B | 20 |
| Comparative Example 1' | AS-2 | R-1 | none | B | 15 |
| Comparative Example 2' | AS-1 | R-2 | triethylamine (100 wt %) | B | 20 |
| Comparative Example 3' | AS-2 | R-2 | none | B | 30 |

| | Photosensitive Layer | | | | | |
|---|---|---|---|---|---|---|
| No. | Addition Polymerizable Compound | Binder Polymer | Photoinitiator | Sensitizing Dye | Co-Sensitizer | Dry Coated Weight (mg/m$^2$) |
| Example 1' | M-1 | B-1 | I-1 | S-1 | C-1 | 1.5 |
| Example 2' | M-2 | B-1 | I-1 | S-1 | C-1 | 2 |
| Example 3' | M-1 | B-1 | I-1 | S-1 | C-2 | 1.8 |
| Example 4' | M-1 | B-2 | I-1 | S-2 | C-2 | 1.8 |
| Example 5' | M-1 | B-3 | I-1 | S-1 | C-2 | 1.5 |
| Example 6' | M-1 | B-2 | I-2 | S-1 | C-3 | 1.5 |
| Example 7' | M-2 | B-3 | I-1 | S-1 | C-3 | 2 |
| Comparative Example 1' | M-1 | B-1 | I-1 | S-1 | C-1 | 2 |
| Comparative Example 2' | M-1 | B-1 | I-1 | S-2 | C-1 | 2 |
| Comparative Example 3' | M-2 | B-1 | I-1 | S-1 | C-2 | 2 |

| | | Printing Capability | | |
|---|---|---|---|---|
| No. | Developer Composition | Press Life of Image Area (sheets) | Press Life of Halftone Area | Scumming of Non-Image Area |
| Example 1' | D-1 | 70,000 | good | very good |
| Example 2' | D-2 | 120,000 | good | very good |
| Example 3' | D-2 | 140,000 | good | good |
| Example 4' | D-1 | 100,000 | good | good |
| Example 5' | D-2 | 60,000 | good | very good |
| Example 6' | D-1 | 80,000 | good | very good |
| Example 7' | D-2 | 110,000 | good | very good |
| Comparative Example 1' | D-1 | 5,000 | plate slipping | very good |
| Comparative Example 2' | D-2 | 2,000 | plate slipping | very good |
| Comparative Example 3' | D-1 | 70,000 | plate slipping | slightly scummed |

Examples 8' to 16' and Comparative Examples 4' to 6'

Lithographic printing plate precursor shown in Table 2' were evaluated on the capability in the same manner as in Examples 1' to 6'.

As clearly seen from Tables 1' and 2', the lithographic printing plate precursor in which an interlayer containing a compound capable of forming a complex with aluminum was verified to ensure highly excellent press life and scumming resistance.

TABLE 2'

| | | Interlayer | | | |
|---|---|---|---|---|---|
| No. | Support | Compound Capable of Complex with Al | Additive | Coating solution composition | Dry Coated Weight (mg/m$^2$) |
| Example 8' | AS-1 | P-6 | none | C | 20 |
| Example 9' | AS-2 | P-6 | none | C | 20 |
| Example 10' | AS-2 | P-6 | C-2 (20 wt %) | C | 25 |
| Example 11' | AS-1 | P-7 | none | C | 15 |
| Example 12' | AS-1 | P-8 | potassium hydroxide (40 wt %) | A | 20 |
| Example 13' | AS-1 | P-9 | none | C | 15 |
| Example 14' | AS-2 | P-10 | none | C | 20 |
| Example 15' | AS-1 | P-10 | potassium hydroxide (25 wt %) | A | 25 |
| Example 16' | AS-2 | P-11 | none | C | 20 |
| Comparative Example 4' | AS-2 | R-1 | B-1 (100 wt %) | A | 30 |
| Comparative Example 5' | AS-1 | R-3 | none | B | 20 |
| Comparative Example 6' | AS-2 | R-3 | C-1 (10 wt %) | A | 10 |

| | Photosensitive Layer | | | | | |
|---|---|---|---|---|---|---|
| No. | Addition Polymerizable Compound | Binder Polymer | Photoinitiator | Sensitizing Dye | Co-Sensitizer | Dry Coated Weight (mg/m$^2$) |
| Example 8' | M-1 | B-1 | I-1 | S-1 | C-1 | 1.5 |
| Example 9' | M-2 | B-1 | I-1 | S-1 | C-1 | 2 |
| Example 10' | M-2 | B-1 | I-1 | S-1 | C-2 | 2 |
| Example 11' | M-1 | B-3 | I-1 | S-2 | C-2 | 1.8 |
| Example 12' | M-1 | B-3 | I-2 | S-2 | C-3 | 1.5 |
| Example 13' | M-2 | B-2 | I-2 | S-1 | C-3 | 1.5 |
| Example 14' | M-2 | B-2 | I-2 | S-1 | C-3 | 2 |
| Example 15' | M-1 | B-2 | I-1 | S-1 | C-3 | 2 |
| Example 16' | M-1 | B-2 | I-1 | S-1 | C-3 | 2 |
| Comparative Example 4' | M-1 | B-1 | I-1 | S-1 | C-1 | 2 |
| Comparative Example 5' | M-1 | B-3 | I-1 | S-2 | C-3 | 2 |
| Comparative Example 6' | M-1 | B-3 | I-1 | S-2 | C-3 | 2 |

| | | Printing Capability | | |
|---|---|---|---|---|
| No. | Developer Composition | Press Life of Image Area (sheets) | Press Life of Halftone Area | Scumming of Non-Image Area |
| Example 8' | D-2 | 180,000 | good | good |
| Example 9' | D-1 | 120,000 | good | very good |
| Example 10' | D-1 | 150,000 | good | good |
| Example 11' | D-2 | 100,000 | good | very good |
| Example 12' | D-2 | 230,000 | good | good |
| Example 13' | D-2 | 150,000 | good | very good |
| Example 14' | D-2 | 160,000 | good | very good |
| Example 15' | D-2 | 190,000 | good | good |
| Example 16' | D-2 | 200,000 | good | very good |
| Comparative Example 4' | D-1 | 10,000 | plate slipping | good |
| Comparative Example 5' | D-2 | 40,000 | good | slightly scummed |
| Comparative Example 6' | D-1 | 60,000 | good | scummed |

The compounds described in Tables 1' and 2' are shown below.

Compounds Capable of Forming a Complex with Aluminum Shown in Tables 1' and 2':

(P-1)
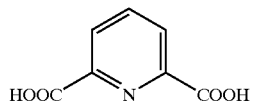

(P-2)
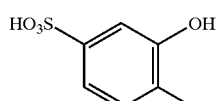

(P-3)
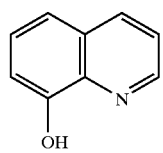

(P-4)
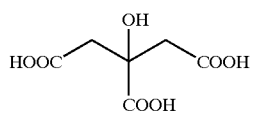

(P-5)
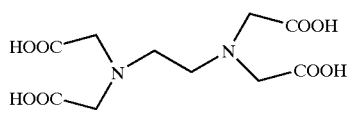

(P-6)
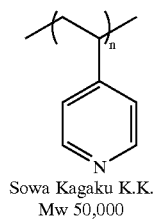
Sowa Kagaku K.K.
Mw 50,000

(P-7)
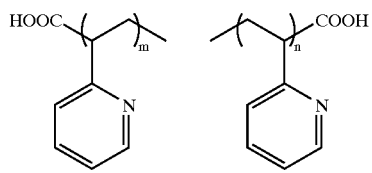
Sowa Kagaku K.K.
Mw 1,000 to 50,000

(P-8)
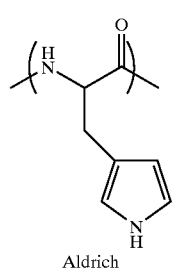
Aldrich

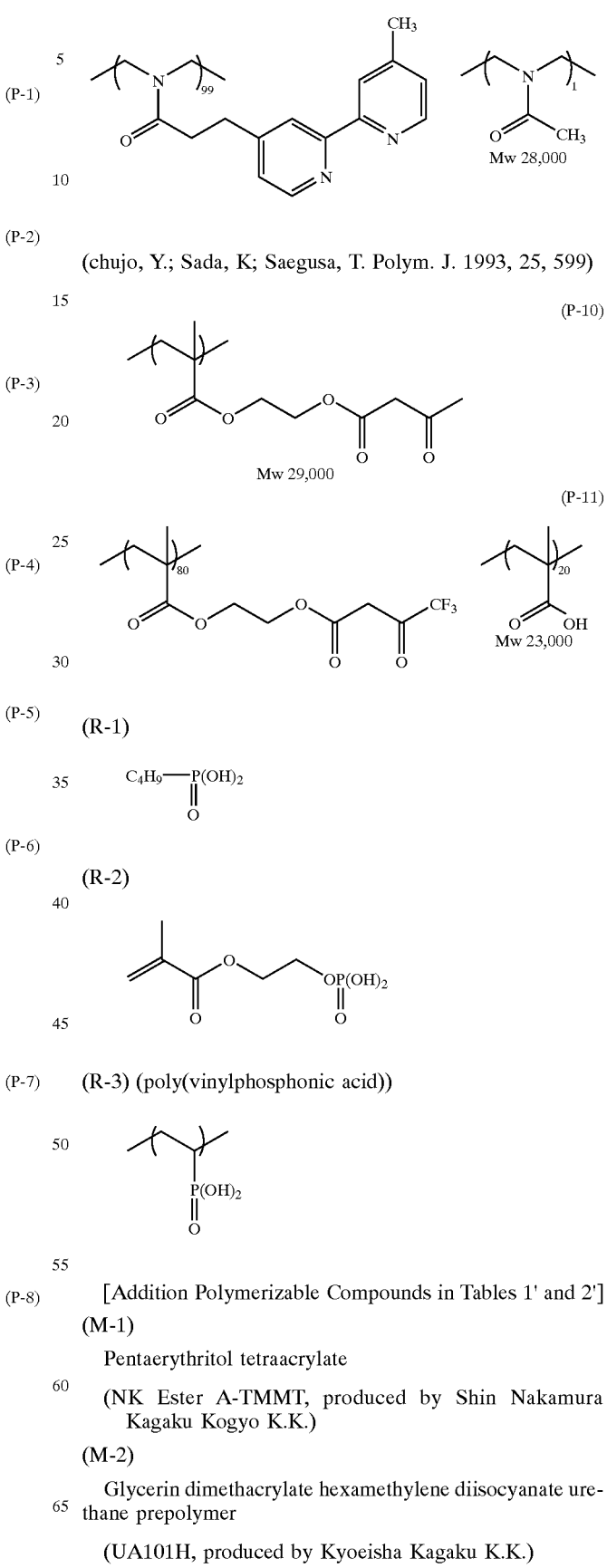

(chujo, Y.; Sada, K; Saegusa, T. Polym. J. 1993, 25, 599)

(R-3) (poly(vinylphosphonic acid))

[Addition Polymerizable Compounds in Tables 1' and 2']

(M-1)

Pentaerythritol tetraacrylate (NK Ester A-TMMT, produced by Shin Nakamura Kagaku Kogyo K.K.)

(M-2)

Glycerin dimethacrylate hexamethylene diisocyanate urethane prepolymer (UA101H, produced by Kyoeisha Kagaku K.K.)

[Materials for Photopolymerization Initiators in Tables 1' and 2']

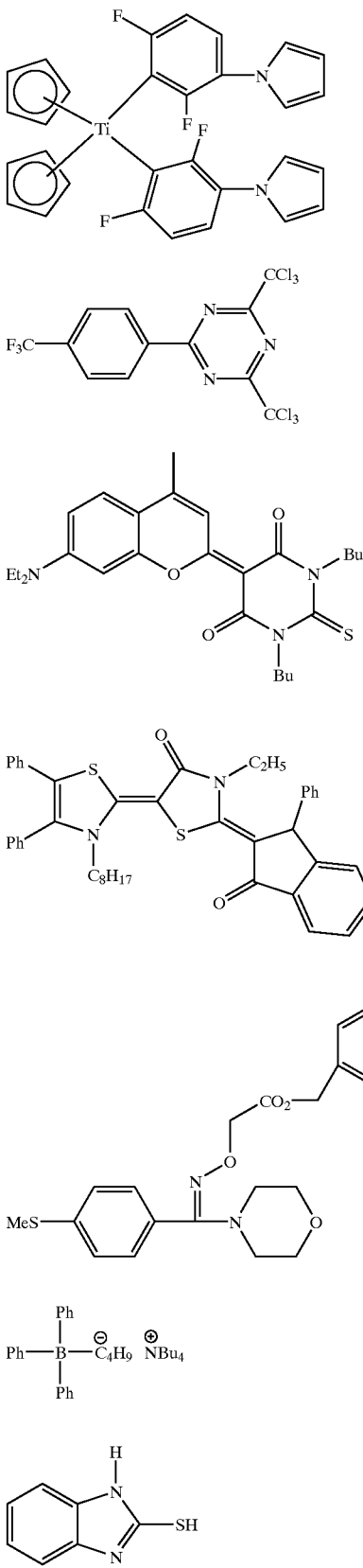

I-1

I-2

S-1

S-2

C-1

C-2

C-3

[Binder Polymers in Tables 1' and 2']

(B-1)
Allyl methacrylate/methacrylic acid/N-isopropylacrylamide (copolymerization molar ratio: 67/13/20)
  Actual acid value determined by NaOH titration: 1.15 meq/g
  Weight-average molecular weight determined by GPC: 130,000

(B-2)
Allyl methacrylate/methacrylic acid copolymer (copolymerization molar ratio: 83/17)
  Actual acid value determined by NaOH titration: 1.55 meq/g
  Weight-average molecular weight determined by GPC: 125,000

(B-3)
Polyurethane resin as a condensation polymerized product of the following diisocyanate and diol:
  4,4'-diphenylmethane diisocyanate (MDI), hexamethylene diisocyanate (HMDI), polypropylene glycol (weight-average molecular weight: 1,000) (PPG1000), and
  2,2-bis(hydroxymethyl)propionic acid (DMPA) copolymerization molar ratio (MDI/HMDI/PPG1000/DMPA): 40/10/15/35
  Actual acid value determined by NaOH titration: 1.05 meq/g
  Weight-average molecular weight determined by GPC: 45,000

[Developer in Tables 1' and 2']

(D-1)
An aqueous solution having a pH of 10 comprising the following composition:

| | |
|---|---|
| Monoethanolamine | 0.1 part by weight |
| Triethanolamine | 1.5 parts by weight |
| Compound of formula 1 shown below | 4.0 parts by weight |
| Compound of formula 2 shown below | 2.5 parts by weight |
| Compound of formula 3 shown below | 0.2 part by weight |
| Water | 91.7 parts by weight |

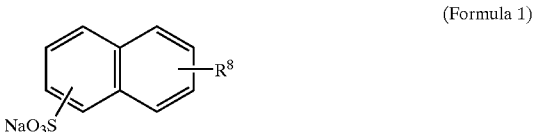

(Formula 1)

(Formula 2)

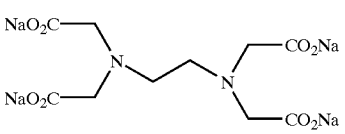

(Formula 3)

In (formula 1) above, $R^8$ represents hydrogen atom or a butyl group.

(D-2)

An aqueous solution comprising the following composition

| | |
|---|---|
| 1K Potassium silicate | 3.0 parts by weight |
| Potassium hydroxide | 1.5 parts by weight |
| Compound of formula 3 above: | 0.2 part by weight |
| Water | 95.3 parts by weight |

[Effects of the Invention]

As described in the foregoing pates, the lithographic printing plate precursor of the present invention has an interlayer containing a cationic group and a radical reactive group between the support and the photosensitive layer, so that very excellent press life and scumming resistance can be provided. Furthermore, the lithographic printing plate precursor of the present invention exhibits sufficiently high practical sensitivity in the scanning exposure by a laser ray.

While the invention has been described in detail and with reference to specific embodiments thereof, it will be apparent to one skilled in the art that various changes and modifications can be made therein without departing from the spirit and scope thereof.

This application is based on Japanese patent applications No. Hei-11-284091 filed on Oct. 5, 1999, No. Hei-11-322641 filed on Nov. 12, 1999, and No. 2000-14697 filed on Jan. 24, 2000, the entire contents of which are incorporated herein by reference.

What is claimed is:

1. A lithographic printing plate precursor comprising a hydrophilized aluminum support having provided thereon in sequence an interlayer and a photopolymerizable photosensitive layer, the interlayer containing a polymer having a cationic group and a radical reactive group and the photopolymerizable photosensitive layer containing a photopolymerization initiator, an addition polymerizable compound comprising an addition polymerizable ethylenically unsaturated bond, and a polymer binder.

2. A lithographic printing plate precursor comprising a hydrophilized aluminum support having provided thereon in sequence an interlayer containing a compound capable of forming a complex with aluminum and a photopolymerizable photosensitive layer containing a photopolymerization initiator, an addition polymerizable compound comprising an addition polymerizable ethylenically unsaturated bond, and a polymer binder, the compound capable of forming a complex with aluminum giving a stability constant in the aluminum complex such that the common logarithmic value thereof is 8 or more.

3. A lithographic printing plate precursor comprising a hydrophilized aluminum support having provided thereon in sequence an interlayer containing a compound capable of forming a complex with aluminum and a photopolymerizable photosensitive layer containing a photopolymerization initiator, an addition polymerizable compound comprising an addition polymerizable ethylenically unsaturated bond, and a polymer binder, wherein the compound capable of forming a complex with aluminum is a polymer having a structure represented by formula (I) on the side chain:

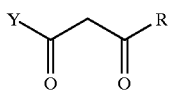
(I)

wherein R represents a hydrocarbon group having from 1 to 30 carbon atoms, which may have a substituent, and Y represents a linking group to the polymer main chain skeleton.

4. The lithographic printing plate precursor according to claim 3, wherein an acid group is combined with the polymer having the structure represented by formula (1).

5. The lithographic printing plate precursor according to claim 4, wherein the acid group has an acid dissociation constant of 7 or less.

6. The lithographic printing plate precursor according to claim 5, wherein the acid group is selected from the group consisting of —COOH, —SO$_3$H, —OSO$_3$H, —PO$_3$H$_2$, —OPO$_3$H$_2$, —CONHSO$_2$— and —SO$_2$NHSO$_2$—.

7. A lithographic printing plate precursor comprising a hydrophilized aluminum support having provided thereon in sequence an interlayer containing a compound capable of forming a complex with aluminum and a photopolymerizable photosensitive layer containing a photopolymerization initiator, an addition polymerizable compound comprising an addition polymerizable ethylenically unsaturated bond, and a polymer binder, wherein the compound capable of forming a complex with aluminum is a polymer having a structure represented by formula III on the side chain:

$$Y^2—Ar \qquad (III)$$

wherein Y$^1$ represents a substituted or unsubstituted divalent hydrocarbon group having from 1 to 30 carbon atoms, which may be interrupted once or more by a functional group containing one or more hetero atom selected from the group consisting of oxygen atom, nitrogen atom and sulfur atom and Ar represents a heteroaryl group having one or more nitrogen atom, which may have a substituent.

8. A lithographic printing plate precursor comprising a hydrophilized aluminum support having provided thereon in sequence an interlayer containing a compound capable of forming a complex with aluminum and a photopolymerizable photosensitive layer containing a photopolymerization initiator, an addition polymerizable compound comprising an addition polymerizable ethylenically unsaturated bond, and a polymer binder, wherein the compound capable of forming a complex with aluminum is a polymer having a structure represented by formula (II) and an acid group on the side chain:

$$Y—Ar \qquad (II)$$

wherein Y represents a linking group to the polymer main chain skeleton and Ar represents a heteroaryl group having one or more nitrogen atom, which may have a substituent.

9. The lithographic printing plate precursor according to claim 8, wherein the acid group has an acid dissociation constant of 7 or less.

10. The lithographic printing plate precursor according to claim 9, wherein the acid group is selected from the group consisting of —COOH, —SO$_3$H, —OSO$_3$H, —PO$_3$H$_2$, —OPO$_3$H$_2$, —CONHSO$_2$— and —SO$_2$NHSO$_2$—.

* * * * *